(12) United States Patent
Ware et al.

(10) Patent No.: US 6,226,754 B1
(45) Date of Patent: May 1, 2001

(54) APPARATUS AND METHOD FOR DEVICE TIMING COMPENSATION

(75) Inventors: Frederick A. Ware, Los Altos Hills; Richard M. Barth, Palo Alto; Donald C. Stark, Los Altos; Craig E. Hampel, San Jose; Ely K. Tsern, Los Altos; Abhijit M. Abhyankar, Sunnyvale, all of CA (US)

(73) Assignee: Rambus Incorporated, Mountain View, CA (US)

( * ) Notice: Subject to any disclaimer, the term of this patent is extended or adjusted under 35 U.S.C. 154(b) by 0 days.

(21) Appl. No.: 09/169,687

(22) Filed: Oct. 9, 1998

Related U.S. Application Data

(60) Provisional application No. 60/061,769, filed on Oct. 10, 1997.

(51) Int. Cl.[7] ....................................................... G06F 1/04
(52) U.S. Cl. ........................... 713/400; 713/401; 713/503
(58) Field of Search .................................... 713/400, 401, 713/503, 600; 365/189.01, 194, 233

(56) References Cited

U.S. PATENT DOCUMENTS

| 5,600,605 | 2/1997 | Schaefer . |
| 5,615,358 | 3/1997 | Vogley . |
| 5,654,936 | 8/1997 | Cho . |
| 5,657,481 | 8/1997 | Farmwald et al. . |
| 5,835,956 | * 11/1998 | Park et al. ............................ 711/167 |
| 5,936,977 | * 8/1999 | Churchill et al. ...................... 714/26 |
| 6,043,684 | * 3/2000 | Landry ................................... 326/98 |

FOREIGN PATENT DOCUMENTS

| 0 660 329 A2 | 6/1995 | (EP) . |
| 2 250 359 | 6/1992 | (GB) . |
| WO 97/23042 | 6/1997 | (WO) . |

* cited by examiner

*Primary Examiner*—Dennis M. Butler
(74) *Attorney, Agent, or Firm*—Pennie & Edmonds LLP

(57) ABSTRACT

An electronic device with device timing constraints includes a set of connections coupled to an interconnect structure that carries row and column commands. A memory core stores data. A memory interface is connect to the set of connections and the memory core. The memory interface includes circuitry for generating memory core timing signals in accordance with the row commands and the column commands. The memory core timing signals have timing constraints to insure correct memory core operation. The memory interface circuitry includes individual delay components for adjusting the timing of selected timing signals of the memory core timing signals.

29 Claims, 36 Drawing Sheets

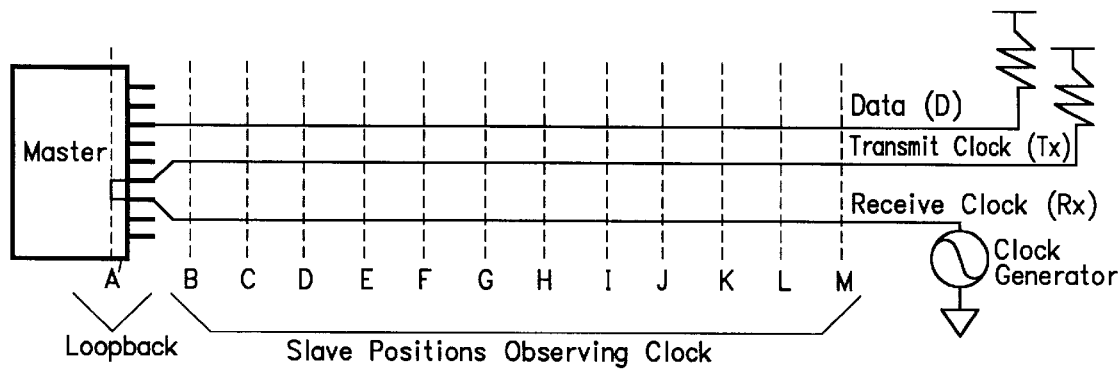
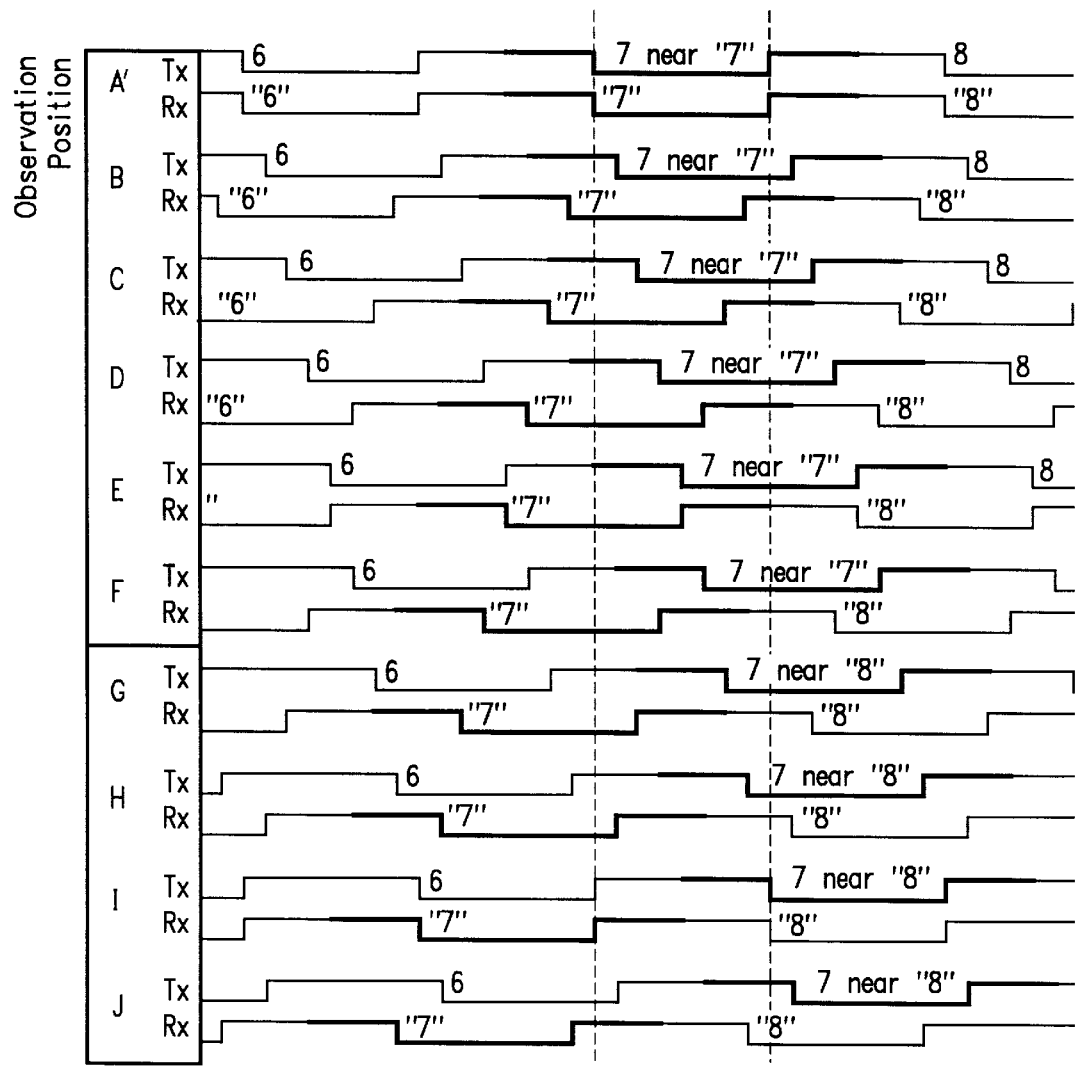
*FIG. 23*
*PRIOR ART*

CAS Latency = 2
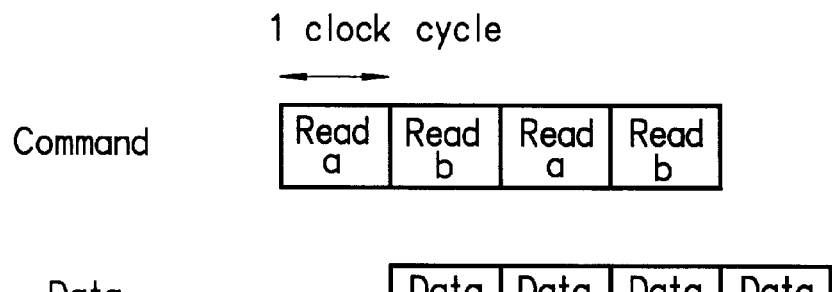
CAS Latency = 3
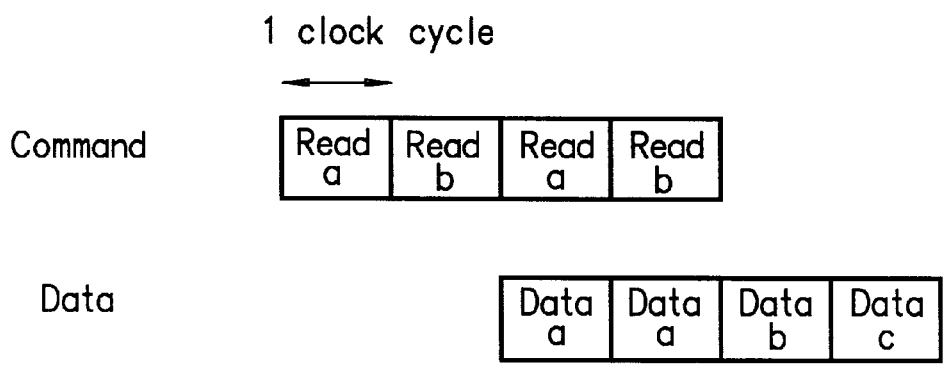
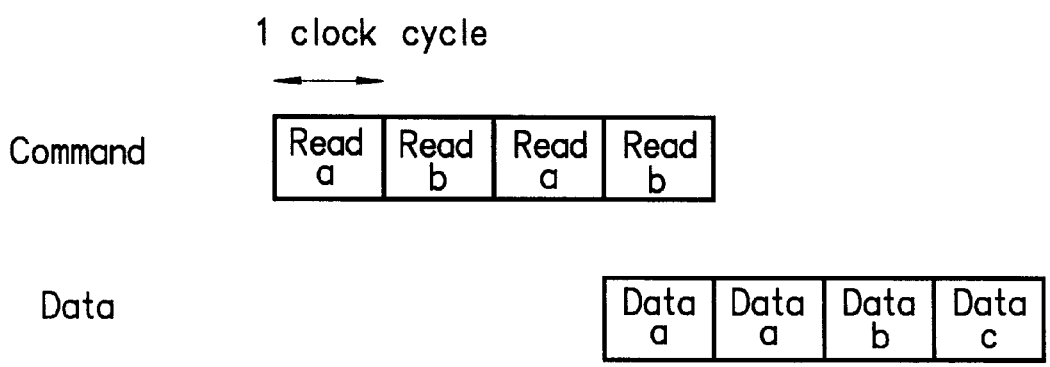
FIG. 26
PRIOR ART Step 1. For each device, initialize device to perform reads and writes.

Step 2. For each device, write 'tDAC Cycles' register to minimum value based on frequency of operation and tDAC requirements of the memory core.

Step 3. For each device, write 'Read Delay Cycles' register to 0.

Step 4. For each device, perform a memory write with data that will be distinctive from observation of the quiescent bus.

Step 5. For each device, read the location that was written in the earlier step and note the number of cycles for the data to be returned.

Step 6. Note the maximum number of cycles to respond of any of the devices, as the 'system read delay'

Step 7. For each device,
- calculate the required additional read delay as the
'system read delay' minus the observed read delay for the device
- write the 'Read Delay Cycles' register to the required read delay value, not exceeding the maximum allowable value for this register
- increase the 'tDAC Cycles' register for any additional read delay required that could not be accomodated in the 'Read Delay Cycles' register

*FIG. 40*

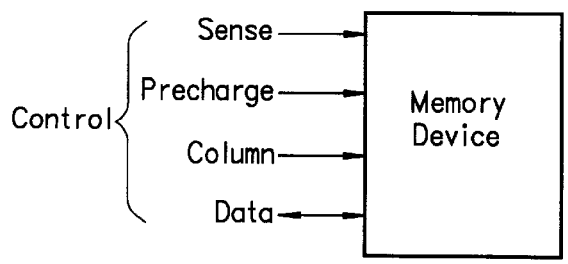

*FIG. 41*

Step 1. For each device,
-read the minimum value allowed for tCLS
-divide the obtained value by the time for 1 cycle of the clock
-take the ceiling of the results of the division
-write the result of the ceiling operation to the 'tCLS Cycles' register Step 2. For each device,
-read the minimum value allowed for tDAC
-divide the obtained value by the time for 1 cycle of the clock
-take the ceiling of the results of the division
-write the result of the ceiling operation to the 'tDAC Cycles' register Step 3. For each device,
-read the minimum value allowed for tCPS
-divide the obtained value by the time for 1 cycle of the clock
-take the ceiling of the results of the division
-write the result of the ceiling operation to the 'tCPS Cycles' register Step 4. For each device,
-read the minimum value allowed for tCAS
-divide the obtained value by the time for 1 cycle of the clock
-take the ceiling of the results of the division
-write the result of the ceiling operation to the 'tCAS Cycles' register

*FIG. 46*

APPARATUS AND METHOD FOR DEVICE TIMING COMPENSATION

This application claims priority to the provisional patent application entitled "Device Timing Compensation", Ser. No. 60/061,769, filed Oct. 10, 1997.

BACKGROUND OF THE INVENTION

1. Field of the Invention

This invention relates generally to digital electronic systems. More particularly, this invention relates to techniques for efficiently transferring information in digital electronic systems.

2. Description of the Related Art

In a generalized multi-device digital electronic system, there can be multiple aster and slave devices which are connected by an interconnect structure, as shown in FIG. 1. Wires between the components form the interconnect. Transport of information over the interconnect occurs from transmitter to receiver, where the master or the slave components can act as either transmitter or receiver.

One particularly interesting case is when the slave is a memory device and there is a single master, as shown in FIG. 2. Because of the high occurrence of read operations in typical memory reference traffic, an important case is the transmission of control information from master to slave and the return transmission of read data from slave to master. The round trip delay forms the read latency.

In a pipelined system, total delay to perform an operation is divided into clock cycles by dividing the entire datapath into separate pipe stages. In a pipelined memory system, total read latency is also divided into clock cycles. As operating frequency increases, delay variations from both the interconnect and components are exposed. These delay variations can cause logical device-to-device conflicts which make the operation pipeline less efficient. It is thus desirable to compensate for these timing variations, which can occur depending on the position of the memory parts on the channel and internal delays in the memory devices.

Before discussing the sources of timing variation in a memory system, some background information on the structure and operation of memory cores is provided.

Memory Structure and Operation

In this section memory operations are defined. FIG. 3 illustrates a memory with a memory core and a memory interface. The memory interface interacts with an interconnect structure. The following discussion expands upon the generic memory elements of FIG. 3 to identify separate structural elements and to discuss the memory operations and memory interactions with the interconnect.

General Memory Core

In this subsection the structure of memory cores into rows and columns is illustrated and the primitive operations of sense, precharge, read, and write are introduced.

A simple memory core typically consists of a storage array, column decoder, row decoder, and sense amplifiers, as shown in FIG. 4. The interface 100 to a memory core generally consists of a row address 101, column address 103, and data path 102. The storage array, shown in FIG. 6, is organized into rows and columns of storage cells, each of which stores one bit of information. Accessing the information in the storage array is a two step process. First, the information is transferred between the storage array and the sense amplifiers. Second, the information is transferred between the sense amplifiers and the interface via connection 100.

The first major step, transferring information between the storage array and the sense amplifiers, is called a "row access" and is broken down into the minor steps of precharge and sense. The precharge step prepares the sense amplifiers and bit lines for sensing, typically by equilibrating them to a midpoint reference voltage. During the sense operation, the row address is decoded, a single word line is asserted, the contents of the storage cell is placed on the bit lines, and the sense amplifier amplifies the value to a full rail state, completing the movement of the information from the storage array to the sense amplifiers. An important observation is that the sense amps can also serve as a local cache which stores a "page" of data which can be more quickly accessed with column read or write accesses.

The second major step, transferring information between the sense amplifiers and the interface, is called a "column access" and is typically performed in one step. However, variations are possible in which this major step is broken up into two minor steps, e.g. putting a pipeline stage at the output of the column decoder. In this case the pipeline timing has to be adjusted.

From these two major steps, four primary memory operations result: precharge, sense, read, and write. (Read and write are column access operations.) All memory cores support these four primary operations or some subset of these operations. As later sections describe, some memory types may require additional operations that are required to support a specific memory core type.

As shown in FIG. 5, memory cores can also have multiple banks, which allow simultaneous row operations within a given core. Multiple banks improve memory performance through increased bank concurrency and reduced bank conflicts. FIG. 5 shows a typical core structure with multiple banks. Each bank has its own storage array and can have its own set of sense amplifiers to allow for independent row operations. The column decoder and datapath are typically shared between banks.

FIG. 6 shows the generic storage array structure. As shown, the word line (106) accesses a row of storage cells, which in turn transfers the stored data on to the bit lines (107). While the figure shows a pair of bit lines connected to each storage cell, some core organizations may require only one bit line per cell, depending on the memory cell type and sensing circuits.

The general memory core just described provides the basic framework for memory core structure and operations. However, there are a variety of core types, each with slight differences in structure and function. The following three sub-sections describe these differences for each major memory type.

Dynamic RAM (DRAM)

This section describes the structure and primitive operations for the conventional DRAM core. The structure of a conventional DRAM core is shown in FIG. 7. Like the generic memory core in FIG. 4, the conventional DRAM structure has a row and column storage array organization and uses sense amplifiers to perform row access. As a result, the four primary memory operations, sense, precharge, read and write, are supported. The figure shows an additional "column amplifier" block, which is commonly used to speed column access.

The core interface 100 consists of the following signals: row address 101, column address 103, data I/O bus 106, row control signals 107 (these signals are defined in detail further in this section), and column control signals 108 (these signals are defined in detail further in this section).

FIG. 8 shows a conventional DRAM core with multiple banks. In this figure, the row decoder, column decoder, and column amplifiers are shared among the banks. Alternative organizations can allow for these elements to be replicated for each bank, but replication typically requires larger die area and thus greater cost. Cheap core designs with multiple banks typically share row decoders, column decoders and column datapaths between banks to minimize die area.

Conventional DRAM cores use a single transistor (1T) cell. The single transistor accesses a data value stored on a capacitor, as shown in FIG. 9. This simple storage cell achieves high storage density, and hence a low cost per bit, but has two detrimental side effects. First, it has relatively slow access time. The relatively slow access time arises because the passive storage capacitor can only store a limited amount of charge. Row sensing for conventional DRAM takes longer than for other memory types with actively-driven cells, such as SRAM. Hence, cheap DRAM cores generally result in slow row access and cycle times. Another problem is that cell refresh is required. Since the bit value is stored on a passive capacitor, the leakage current in the capacitor and access transistor result in degradation of the stored value. As a result, the cell value must be "refreshed" periodically. The refresh operation consists of reading the cell value and rewriting the value back to the cell. These two additional memory operations are named refresh sense and refresh precharge, respectively. In traditional cores, refresh sense and refresh precharge were the same as regular sense and precharge operations. However, with multiple bank cores, special refresh operations are advantageous to enable dedicated refresh circuits and logic to support multibank refresh.

FIG. 10 shows details of a bit slice of a typical row datapath, and FIG. 11 shows the timing diagram of a precharge and sense operation. To perform a row access, the bit lines and sense amplifiers must first be precharged, typically to the Vdd/2 midpoint. The row precharge time, tRP, is shown in FIG. 11.

To perform a sense operation, the row decoder drives a single word line to turn on access transistors to a row of memory cells. The charge on the storage capacitor transfers to the bit line, slightly changing its voltage. The sense amplifier detects this small voltage change and drives the bit lines to full rail (Vdd and Gnd). The wordline must be held high a significant portion of the time period of tRAS,min to complete the sensing operation. At some time before the bit lines reach full rail, a column read or write access can begin. The time between the start of the sense operation and the earliest allowable column access is TRCD, row to column access delay.

The total time to perform both precharge and sense is tRC, the row cycle time, and is a primary metric for core performance. Table 1 shows typical DRAM row timing values.

TABLE 1

Typical DRAM Row Timing Parameters

| Symbol | Description | Value | Units |
| --- | --- | --- | --- |
| tRP | Row precharge time | 20 | ns |
| tRCD | Row to column delay | 26 | ns |
| tRC | Row cycle time | 80 | ns |
| tRAS, min | Minimum row active time | 60 | ns |

It is important to note that memory device timing parameters can vary widely across various device designs, manufacturing processes, supply voltage, operating temperature, and process generations. In order for the memory architecture to be widely usable, it is very important for the protocol to be able to support these variable row and column timings.

FIG. 10 shows a common cell organization which alternates cell connections between wordlines. This leads to a dense packing of cells and also allows the sense amplifier to use the voltage on the unused bitline as a reference for differential bit line sensing.

Separate PRECH and SENSE control can be used at the core interface. Traditional cores use a single control signal, commonly called RAS, and use the rising and falling edges to distinguish between sense and precharge. Separated PRECH and SENSE signals, together with a separate bank address for sense and precharge, support cores with pipelined precharge and sense operations occurring in multiple banks.

The row sensing power includes the power to decode the row address, drive the wordline high, and turn on the sense amplifiers, which must drive the bit lines from Vdd/2 to Vdd and Gnd. Thus, a significant portion of row sense power is proportional to the number of sense amplifiers that are turned on (i.e., the page size).

FIG. 12 shows an example of row access timing diagram for DRAMs with multiple banks. The period $t_{SS}$ specifies the minimum delay between sense operations to different banks. Similarly, the period $t_{PP}$ specifies the minimum delay between precharge operations to different banks.

FIG. 13 is a more detailed diagram of a typical DRAM column datapath. The output of the column decoder, which may be placed in a register for pipelined designs, drives a single column select line, which selects some fraction of outputs from the sense amplifiers. The selected sense amplifiers then drive the data on to the column I/O wires. To speed column access time, the column I/O lines are typically differential and sensed using differential column amplifiers, which amplify small voltage differences on the column I/O wires and drive the data I/O bus to the interface. The width of the column I/O bus sets the data granularity of each column access, also known as CAS block granularity.

The data I/O can either be bidirectional, in which write and read data are multiplexed on the same bus, or unidirectional, in which write and read data have separate buses. FIG. 13 shows unidirectional data I/O.

Column access power consists of the power to decode the column address, drive the column select line, turn on the column amplifiers, and drive the column I/O wires. Column power is roughly proportional to the column cycle frequency and the width of the column I/O datapath.

Some DRAM cores also include the ability to mask write data, so that some bits or bytes of the datapath are not written depending on the mask pattern. Typically, the mask pattern is delivered to the column amplifier write circuit, which inhibits the write data appropriately.

A timing diagram for a column read operation is shown in FIG. 14. The key timing parameters of the column read access are:

tPC, column cycle time: the minimum cycle time of a column access. This parameter determines how fast data can be cycled to and from the memory core. The CAS block granularity divided by tPC equals the core data bandwidth.

tCLS, COLLAT setup to COLCYC: the minimum set-up time of latching the column address to the rising edge of COLCYC, when data access from the sense amplifiers starts.

tDAC, column read access delay: the delay from the rising edge of COLCYC to when READDATA is valid at the interface.

tCAS: the minimum time that COLCYC stays high. This parameter sets the maximum time it takes to transfer data from the sense amplifiers to the column amplifiers and determines when column precharge can start.

tCP, column precharge: the minimum time that COLCYC stays low. This parameter sets the maximum time it takes to precharge the column I/O wires.

tCPS, COLCYC low setup to row precharge: the minimum set up time that COLCYC stays low before row precharge begins. This parameter is important since tCAS+tCPS determines when a row precharge operation can begin relative to the start of a column operation.

tDOH, data output hold time: tDOH is the minimum hold time of READDATA after the next COLCYC rising edge. Note: tPC−tDAC+tDOH determines the READDATA minimum valid window at the core interface.

tASC, column address setup: the minimum column address set up time before COLLAT rising edge.

tCAH, column address hold: the minimum column address hold time after COLLAT rising edge. Note: tASC+tCAH determine the minimum column address valid window that must be observed to perform a column operation to the core.

tCLL, COLLAT low: the minimum time that COLLAT stays low.

tCLH, COLLAT high: the minimum time that COLLAT stays high.

A timing diagram for column write operation is shown in FIG. 15. Many timing parameters, which include tPC, tCAS, tCP, tCLS, tCPS, tCLL, tCLH, tASC and tCAH, are the same as those for column read. Additional key timing parameters of the column write access are tDS, WRITEDATA setup: the minimum WRITEDATA setup time before the rising edge of COLCYC.

tDH, WRITEDATA hold: the minimum WRITEDATA hold time after the falling edge of COLCYC.

Note: tDS+tCAS+tDH determines the minimum WRITEDATA valid window that must be observed to perform a write operation to the core.

tWES, WMASK setup: the minimum set up time for a write mask before the rising edge of COLCYC.

tWEH, WMASK hold: the minimum hold time for a write mask after the falling edge of COLCYC. Note: tWES+tCAS+tWEH determines the minimum WMASK valid window that must be observed to perform a write mask operation to the core.

Table 2 shows typical DRAM column timing values.

TABLE 2

Typical DRAM Column Timing Values

| Symbol | Description | Value | Units |
|---|---|---|---|
| tPC | Column cycle time | 10 | ns |
| tCAS | COLCYC high | 4 | ns |
| tCP | COLCYC low | 4 | ns |
| tCLS | COLLAT to COLCYC setup | 2 | ns |
| tDAC | READDATA valid from COLCYC rising | 7 | ns |
| tCPS | COLCYC low setup time to row precharge | 1 | ns |
| tASC | COLADDR setup to COLLAT rising | 0 | ns |
| tCAH | COLADDR hold from COLLAT rising | 5 | ns |
| tDOH | READDATA hold from next COLCYC rising | 3 | ns |
| tDS | WRITEDATA hold from COLCYC falling | 1 | ns |
| tDH | WRITEDATA hold from COLCYC falling | 1 | ns |
| tWES | WMASK setup to COLCYC rising | 2 | ns |
| tWEH | WMAST hold from COLCYC falling | 0 | ns |

It is important to note that DRAM timing parameters can vary widely across various manufacturing processes, supply voltage, operating temperature, and process generations. In order for the memory architecture to be widely usable, it is very important for the DRAM protocol to be able to support these variable row and column timings.

Typical column cycle times and access times greatly depend on the type of sense amplifier circuit, since the sense amplifier actually drives the data on to the column I/O wires. Increased speeds can be achieved by using more transistors in the sense amplifier circuit to improve drive capability, but this greatly increases the die area and cost since the sense amplifier circuit is heavily replicated. Thus, the desire to minimize die area for commodity DRAMs inhibits the further reduction of column access speeds.

Static RAM (SRAM)

SRAM shares a similar core structure and functional blocks as DRAM. Like DRAM, access is performed in a similar two step process. First, in the sense operation, the information is transferred between the storage array and the sense amplifiers. Second, in the column access operation, the information is transferred between the sense amplifiers and the interface. Also, similar to DRAM, the bitlines must be precharged before sensing occurs, although a typical precharge value is Vdd, not Vdd/2.

The key difference lies in the storage cell. In an SRAM, data is stored statically, typically using a circuit of several transistors. A typical SRAM cell is shown in FIG. 16. The SRAM of FIG. 16 uses cross-coupled CMOS inverters to store a single data bit. A word line turns on access transistors, which connect the cell circuit to differential bit lines. Unlike a DRAM cell, the SRAM cell circuit actively drives the stored value on to the bit lines, thus resulting in faster access time. The static nature of the SRAM cell eliminates the need for cell refresh. However, the static cell also uses more transistors and takes up much more area than a DRAM cell. The four primitive operations of an SRAM are sense, precharge, read and write.

Read-Only Memory

Read-only memory cores store information according to an electrical connection at each cell site which joins rows to columns. Typically, a single transistor forms the electrical connection at each cell site. A simple ROM array is shown in FIG. 17.

There are a variety of ROM cell types, including erasable programmable ROM (EPROM), electrically erasable programmable ROM (EEPROM), flash ROM, and mask programmable ROM. Their differences lie in the type of transistor used at the cell site. However, all ROM types share the common 2-D storage array organization, which requires a row and column decode of the address for each data access.

Unlike SRAMs or DRAMs, not all ROMs have sense amplifier circuits. Sense amplifiers are only used in some ROMs which require fast access times. For these ROMs, the primitive operations are sense, precharge and read.

For slower ROMs that do not use sense amplifiers, the data values are directly driven from the cell to output amps which drive the interface. For these ROMs, the single primitive operation is read.

Summary of Memory Operations

Table 3 summarizes the primary operations for each memory type.

TABLE 3

Memory Operations

| Conventional DRAM | SRAM | ROM[a] |
|---|---|---|
| data = read(device, bank, column) | data = read)device, bank, column) | data = read(device, bank, column) |
| write(device, bank, column, data, mask) | write(device, bank, column, data, mask) | |
| precharge(device, bank) | precharge(device, bank) | precharge(device, bank) |
| sense(device, bank, row) | sense(device, bank, row) | |
| refresh precharge (device, bank)<multi-bank> | | |
| refresh sense(device, bank, row)<multi-bank> | | |

[a]Some ROM organizations without sense amplifiers may not require precharge and sense operations. For these types, data = read(device, bank, row, column).

Memory Operation Sequencing

Based on the operations defined in the previous section, this section describes the allowable sequences of operation for various memory types.

Operation Sequencing for Memory Cores with Sense Amp Caches

The composition of the operations cannot be arbitrary. With memory cores that use sensing to speed row access, such as conventional DRAMs and SRAMs, a bank must be in a sensed state in order to do read or write operations. Furthermore, the bank must be precharged in order to perform a sense operation. As a result, these cores must follow the pattern shown in FIG. 18 with respect to each bank's state, which can be either sensed ("open") or precharged ("closed").

Although all the operation sequences implied by FIG. 18 are allowed, they do not all have equal utility. The application that uses the memory exhibits a characteristic access pattern (a.k.a. reference pattern) which ultimately determines which operation sequences are most useful. These operational sequences can then be optimized through implementation or protocol design to maximize performance and minimize power and area.

Generally, an application will attempt to operate a sense amp memory core in a cached or uncached manner, depending upon the expected locality of reference from one application access to another. Combinations of these approaches are possible, but supporting arbitrary combinations can be an expensive proposition, resulting in either reduced performance or large resource usage both internally to the DRAM as well as externally in the interconnect.

Operating the memory in an uncached manner means that the bank state is closed between application accesses. In other words, the last memory operation performed on that bank is a precharge. In such an operating manner, each application access typically consists of the sequence: sense, series of reads and/or writes, precharge. Uncached usage assumes low reference locality, i.e. subsequent memory access will likely not be located in the same row.

Operating the memory in a cached manner means that the bank state is open between application accesses. In other words, the last memory operation performed on that bank is a sense, read, or write. Cached usage assumes high reference locality, i.e. subsequent memory access will likely be located in the same row. Generally, sense will not be the last memory operation performed since that implies that no useful work was done on behalf of the last application access. However, there are prefetching schemes which may have the last application access perform a sense with no corresponding read or write.

When the bank state has been left open, the following operation can be read, write, or precharge. If it is a read or write, we call this a hit operation, since the row which was left cached in the bank must have been the proper row for the following operation. If it is a precharge, the correct row was not left cached in the bank, so the controller must apply a precharge and sense sequence in order to move the correct row into the bank. We call this type of access a miss operation.

When operating the DRAM in a cached manner, each application access typically consists of the sequence "series of reads and/or writes" (hit) or the sequence "precharge, sense, series of reads and/or writes" (miss).

Since the precharge and sense operations take time and consume power, the optimal strategy for operating the DRAM depends upon the reference characteristics of the application. In the present invention either manner of operation, and mixed manners of operation, are supported.

Other Variations

FIG. 18 shows the operation sequencing for a generic memory core with sense amp caches. Variations of this diagram for different memory cores are also possible and are described in this section.

FIG. 19 shows operation sequencing for a DRAM, which is the same as that shown in FIG. 18, except for the addition of the refresh sense and refresh precharge operations.

FIG. 20 shows an operation sequence for a common class of SRAMs whose sense amps only hold enough data for one read or write access. Note that transition 202, while possible, is not useful since it does not perform any useful work on behalf of the last application access. Also note that writes can occur after either precharge or sense, since the sense amplifiers in SRAMs are only used for read operations. FIG. 21 shows an operation sequence for read-only memories with sense amps. Typically, sense amps only hold enough data for one read access. Note that transition 202, while possible, is not useful since it does not perform any useful work on behalf of the last application access.

Sources of Timing Variation

There are several sources of timing variation in a memory system. One source is the interconnect, also referred to as the channel. With a sufficiently high clock frequency and a long channel, the signal propagation delay of the wire is greater than the bit time. (Here the period of the bit rate is defined as the time it takes to transfer one bit; in the following examples, it is assumed that a bit is transferred on every clock edge, so the bit rate is 2× the clock frequency.) As a result, the interconnect delay varies as a function of physical position on the channel, as FIG. 22 illustrates. Note that the clock edges vary in time depending on the observation position. For this particular clock topology, the interconnect has both 15 transmit and receive clocks going in opposite directions, and FIG. 23 illustrates that the difference between transmit and receive clocks at a given position and time varies more than one clock cycle. It is also important to note that the interconnect delay for a given component doesn't change once its position is fixed.

Another source of timing variation originates from the memory device itself. FIG. 3 shows a representation of a memory device with an interface and memory core. Internal delays in the core can vary from device to device due to process variations, circuit design differences, as well as variations in operation conditions that affect voltage and temperature.

A memory core has four primary operations: precharge, sense, read, and write. Variations can occur in all components of core timing, which include the timing of row operations (sense and precharge), column operations (read and write) and interactions between row and column operations.

Row timing is characterized by the timing parameters in Table 1 and illustrated in the timing diagram in FIG. 11 (row timing). The row precharge time, tRP, is the time it takes to precharge the sense amplifiers and bitlines inside a memory bank in the core. A bank must be precharged before a sense operation can occur. The minimum time between the start of a sense operation and the start of a precharge operation is tRAS,min. The minimum time between sense operations to the same memory bank is the row cycle time, tRC.

Table 2 shows the basic column timing parameters, which are illustrated in the read and write timing diagrams in FIG. 14 and FIG. 15. tCAC is the delay between the latching of the column address and the delivery of read data to the core output. tCAC has two components: tCLS and tDAC. tCLS is the time between the rising edge of COLLAT (when column address is latched) and the rising edge of COLCYC (when data access from the sense amplifiers starts). tDAC is the time between the rising edge of COLCYC and when read data is delivered to the core output. tPC is the column cycle time, i.e. the minimum time between column operations.

The interactions between row and column operations are characterized by the timing parameters tRCD and tCPS and are illustrated in FIG. 11, FIG. 14 and FIG. 15. tRCD is the row to column delay and represents the time between the start of a sense operation and column operation (rising edge of COLCYC). tCPS is the column precharge to row precharge time and represents the time between the start of the column precharge (falling edge of COLCYC) and the start of the row precharge operation.

All these core timings can vary widely across manufacturing processes, process generations, circuit designs, supply voltage fluctuations, and operating temperature. Furthermore, these core timing variations combine with interconnect delay variations to form accumulative system timing variations from device to device.

Motivation for Timing Variation Control

In a pipelined memory system, it is desirable to adjust for or control device-to-device timing variations in order to optimize efficiency in the pipeline so that data bandwidth is maximized, particularly for read operations. The goal is to achieve a fully packed data interconnect when data is being transferred from transmitter to receiver, as illustrated in FIG. 24. As described earlier, either the master or slave can act as the transmitter or receiver; FIG. 24 illustrates a packed channel for either case.

Another desire is to minimize latency. For instance, for a device with a given tRCD, it would be desirable to provide enough fine-grain timing control between the row and column commands so that the delivery of the sense and column core control signals has an offset that closely matches tRCD. Any additional delay between the two commands would result in greater access latency.

Another desire is to minimize complexity. Timing adjustments can be done at either the transmitter or receiver. Since it is very desirable to keep the cost low, all mechanisms that perform timing adjustments, particularly in the memory devices, should have minimum complexity to keep die area and cost as low as possible.

Prior Art

Traditional memory systems use a two-dimensional device topology in which the data signals and control/address signals are orthogonal to each other, as illustrated in FIG. 25. Because of the different trace lengths, capacitive loadings, and unmatched signal impedances, the propagation delay for data and control/address signals differ significantly. Furthermore, device timing also varies between different parts. To account for this, memory controllers typically assume the worst possible interconnect and device timings, so all timing variations are handled by a fixed constant where the controller specifies how fast parts must be and all parts plugged into that system must meet those minimum timings. Unfortunately, it is sometimes difficult to know what the exact worst case will be. Furthermore, with this approach, the memory controller will always operate at the speed of the slowest possible part and interconnect rather than adjusting for the actual speed of the devices or interconnect in a given system. These systems initialize without a boot time procedure that examines the actual device performance of the installed parts.

In many existing synchronous memory systems, the interconnect delay is limited to a single clock cycle, so no interconnect delay compensation is needed. In some existing memory devices, variations in row timing, specifically tRAS,min, tRP, and tRCD, are "internally timed", i.e. row timing delays are handled with internal counters and programmable registers, which store cycle counts to match core timing. Some core timing, such as tCPS, is handled as a fixed design constant.

In some existing memory devices, variations in column read and write delay are handled by a single delay value that is programmable by changing the value in a register. The delay and range of the register are only designed to handle variations in device timing and not interconnect timing. Furthermore, a single delay value is used to cover multiple column read latency components, such as tCLS and tDAC. For example, in one implementation, a register specifies the number of clock cycles between the column control and the column read data, as shown in FIG. 26.

Both of these techniques have their costs and benefits. The all encompassing delay provides a simple control model to the application that does not vary with internal memory device implementation details. However, this requires the memory device to decode for itself how the programmed delay should be used. This can be a very difficult problem since the delay of any one device is not known at design time. A further complication is that the period of the clock during operation is not known, even at final test time when the device delays can be measured. Simple methods for solving this problem are not obvious. Methods involving division of an internal memory device delay by the clock period are not considered simple.

In some existing memory devices, fine timing control is limited due to the overloading of the interconnect control resources. FIG. 27 shows the interconnect structure of one such device, in which all row and column commands are issued over the same command bus. Also, the single address bus is shared for row and column operations. The row timing (tRP and tRAS,min) and row-to-column timing (tRCD, tCPS) variations are handled by adjusting the placement of control information over a single control bus resource. Because of conflicts, the overloading of both row and column commands on a single resource often limits the ability to perform fine timing control that optimally places row and column control to match actual device timings, as illustrated in FIG. 28. Because sense, precharge, read and write commands are issued over the same command bus, the resource quickly becomes overloaded, especially when commands are issued to many banks concurrently. In this figure, for instance, the separation between the precharge and sense to bank b is forced to be two cycles because of the write command to bank a, even though the device may have allowed a separation of one cycle.

In summary, existing memory devices have several inadequacies that limit optimal timing compensation in a high-speed pipelined memory system. First, existing devices are not designed to compensate for multicycle interconnect delay variation. Second, existing devices have a single shared interconnect control and/or address resource, which can limit the ability to have control over row timing and row-to-column timing variation when control information is packetized (occupies multiple cycles) and these parameters are not "internally timed". Third, timing variation of column access latency is typically controlled by a single number and not partitioned into the fundamental delay components that make up the column access latency in the core. Fourth, the column access to row precharge delay (tCPS) is considered a fixed constant in the device and must be compensated by adjusting the timing of external control information. Finally, variations in column cycle time must be compensated by adjusting the timing of external control information.

SUMMARY OF THE INVENTION

An electronic device with device timing constraints includes a set of connections coupled to an interconnect structure that carries row and column commands. A memory core stores data. A memory interface is connected to the set of connections and the memory core. The memory interface includes circuitry for generating memory core timing signals in accordance with the row commands and the column commands. The memory core timing signals have timing constraints to insure correct memory core operation. The memory interface circuitry includes individual delay components for adjusting the timing of selected timing signals of the memory core timing signals.

BRIEF DESCRIPTION OF THE DRAWINGS

For a better understanding of the invention, reference should be made to the following detailed description taken in conjunction with the accompanying drawings, in which:

FIG. 23 illustrates multiple cycle timing for slave devices in a prior art memory system.

FIG. 26 illustrates a programmable column access signal (CAS) latency timing diagram in accordance with the prior art.

FIG. 40 illustrates processing steps associated with an initialization method of the invention.

FIG. 41 illustrates a memory device with a split control bus in accordance with an embodiment of the invention.

FIG. 46 illustrates processing steps associated with an initialization method for device-induced compensation mechanisms in accordance with an embodiment of the invention.

Like reference numerals refer to corresponding parts throughout the drawings.

DETAILED DESCRIPTION OF THE PREFERRED EMBODIMENTS

Timing Compensation for Interconnect Delay Variation

As described in the Background section, the channel has a time of flight which is multiple cycles in duration when the channel is long enough to have sufficient capacity. In such a system, it is critical that the transmitters be able to switch from device to device without an intervening time of flight delay. If this is not the case, then each time a different device is addressed there will be an unacceptable loss in bandwidth.

Presuming that the signalling technology supports driver to driver switching without delay, delay elements could be added to the data paths inside the memory components to get the logical layer to deliver read data to the channel in a fashion that eliminates logical device to device conflicts, or to "levelize" the channel. Note that this differs from the case where delay elements have not been used to handle interconnect delay variation.

Figure 29:
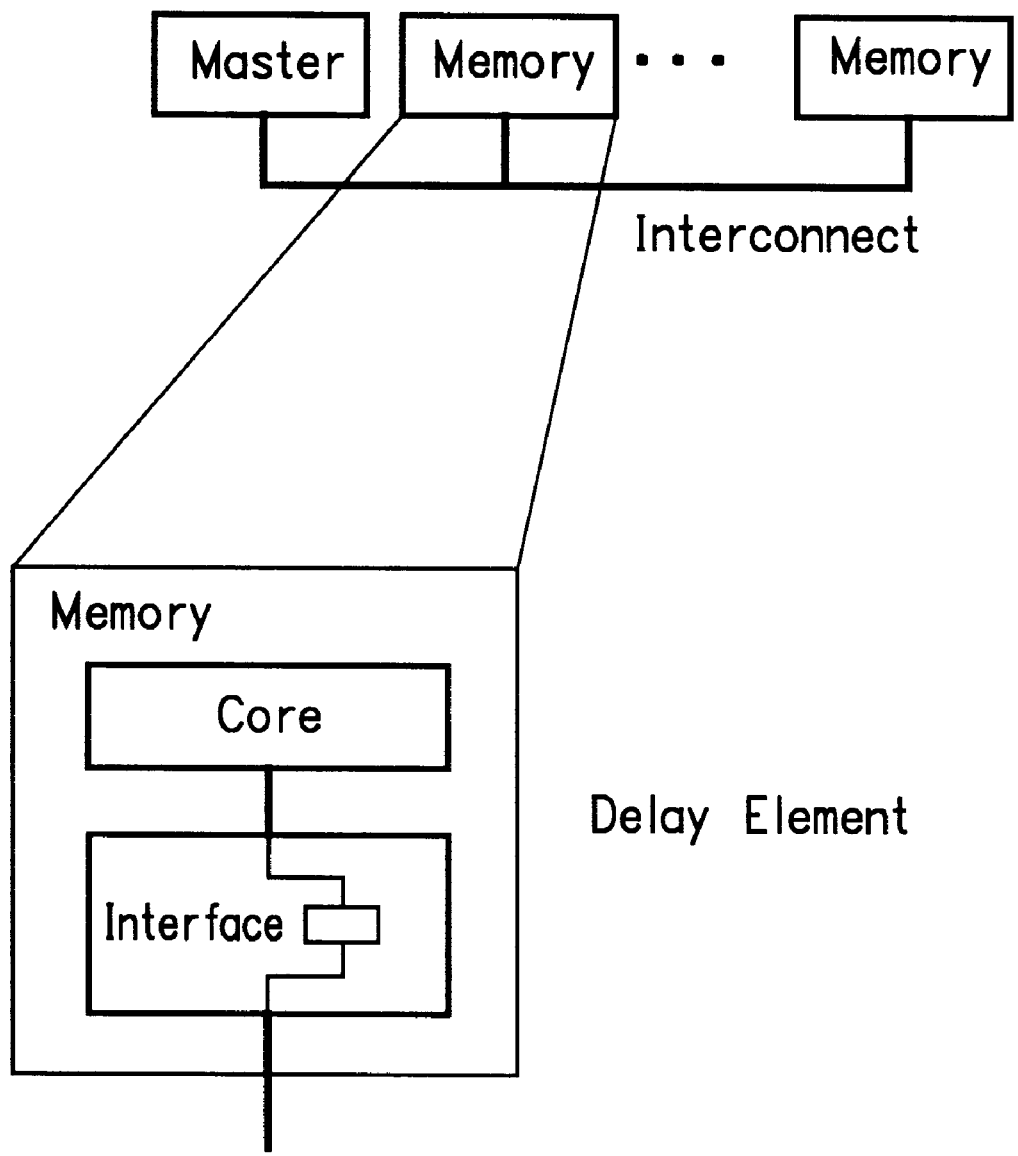
FIG. 29 illustrates a memory device with a delay element in accordance with an embodiment of the invention.

FIG. 29 shows devices with delay elements connected to a multicycle interconnect. The basic idea is to use these delay registers to add an appropriate amount of delay in each device, depending on position on the channel, so that the master sees a uniform minimum latency for all devices. Note that these delay registers are used to compensate interconnect delay, not device variation.

Figure 30:
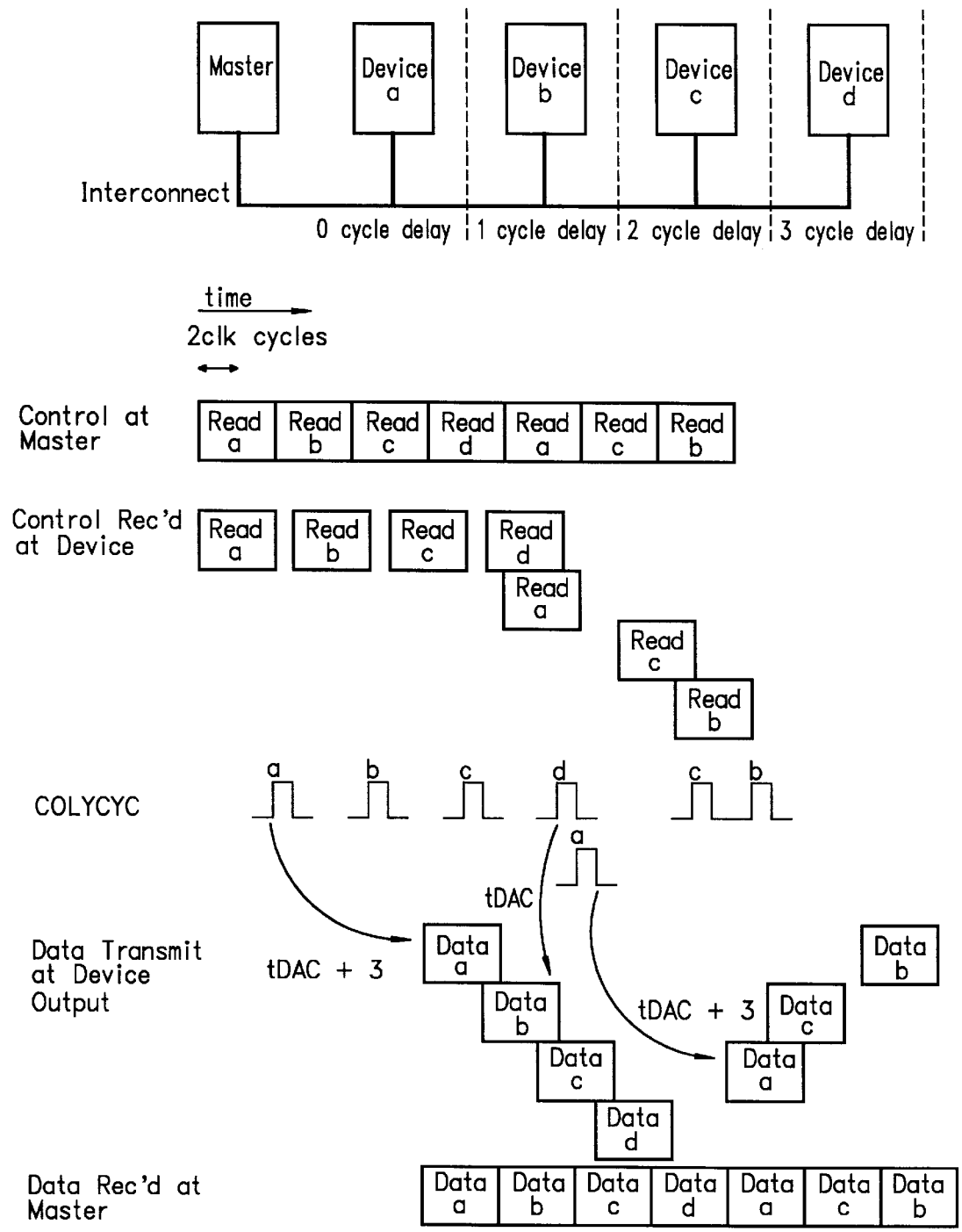
FIG. 30 illustrates a timing diagram of a packed data channel with interconnect delay variation in accordance with an embodiment of the invention.

The timing diagram of FIG. 30 shows how the delay registers adjust for interconnect timing variation and allow the data interconnect to be fully packed. The figure shows four devices on the channel, each placed in a different clock domain, i.e. the signal propagation delay from the master equals 0, 1, 2, and 3 cycles for devices a, b, c, and d respectively. The delay registers in devices a, b, c, and d are programmed to be 3, 2, 1, and 0 cycles respectively. The timing diagrams in the figure show when the control packets are transmitted from the master and when the column operation begins (COLCYC pulse) for each device. Note that because the output of device a is delayed an additional 3 cycles, the back-to-back read from device d to a results in a back-to-back data packet when received at the master. As the diagram shows, even though each device starts its transmission of read data at irregular intervals, the different propagation times down the channel result in a fully packed data stream at the master.

Figure 31:
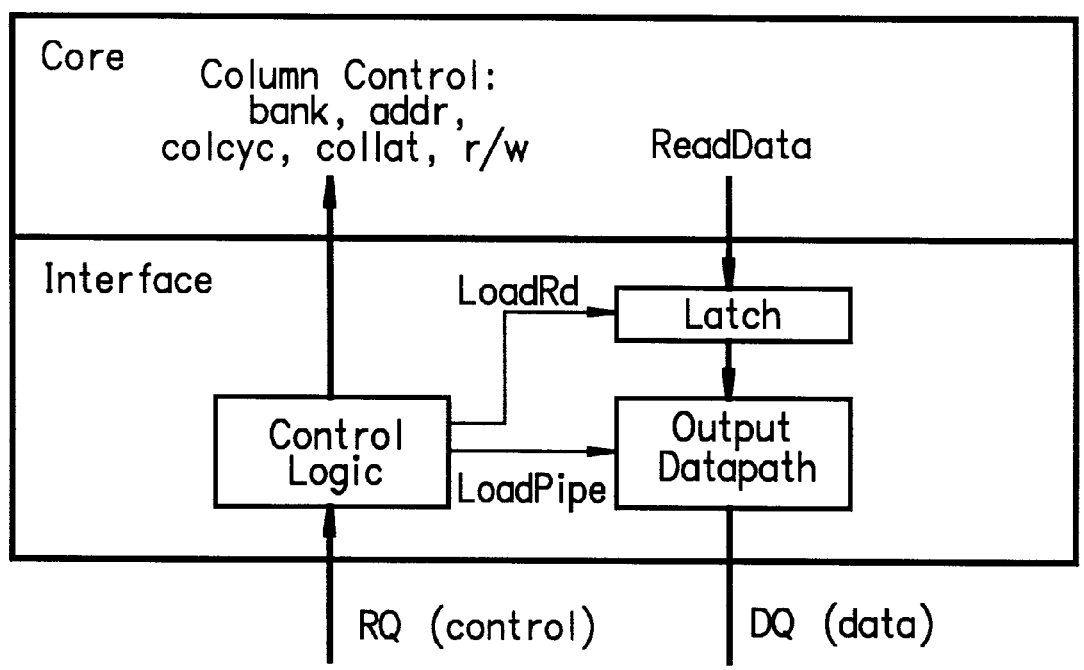
FIG. 31 illustrates a column read datapath in accordance with an embodiment of the invention.
Figure 32:
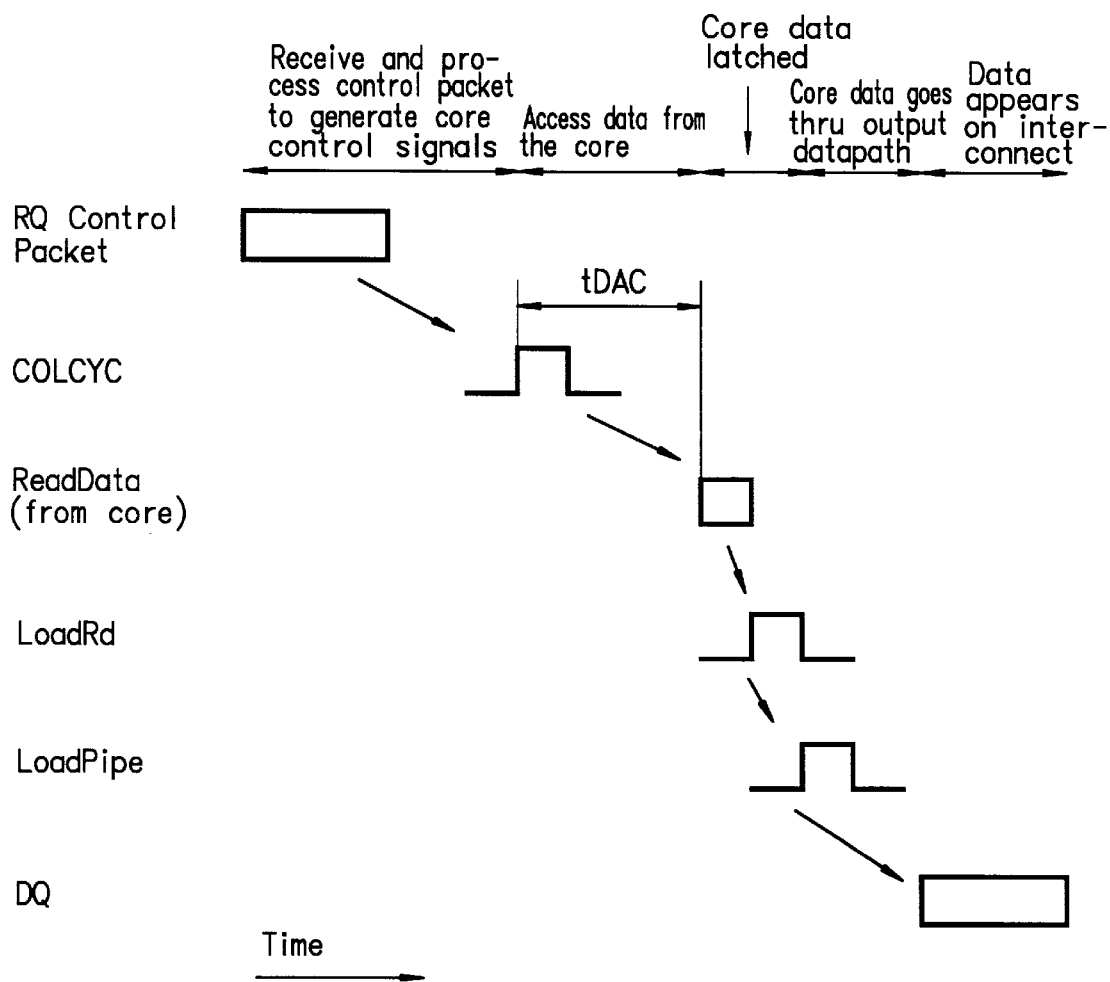
FIG. 32 illustrates column read timing in accordance with an embodiment of the invention.

The delay element mechanism can be implemented in multiple ways. A typical column read datapath is shown in FIG. 31. After receiving a column control packet over the interconnect, the column logic initiates the column read operation in the core. The core control signals for column operations include bank and column addresses, a signal to latch the address (COLLAT), a signal to start the column operation (COLCYC, which stands for column cycle), and the signal to specify read or write (r/w). The column read operation is broken down into multiple steps. After some delay, the data appears at the ReadData output of the core. This data is then loaded into a storage element (e.g., latch) placed between the core and output datapath with a separate load control, LoadRd. The data is then separately loaded into the output datapath using a separate load signal (LoadPipe) and exits the interface. A simplified timing diagram for the read operation is shown in FIG. 32.

Delaying the read data can be done by placing delay anywhere in the read datapath. One way to delay the read data is to delay the start of the column operation by delaying the column control signals to the core; this is called front-end leveling. The other approach is to delay the read data at the core output after the data exits the core; this is called back-end leveling.

Figure 33:
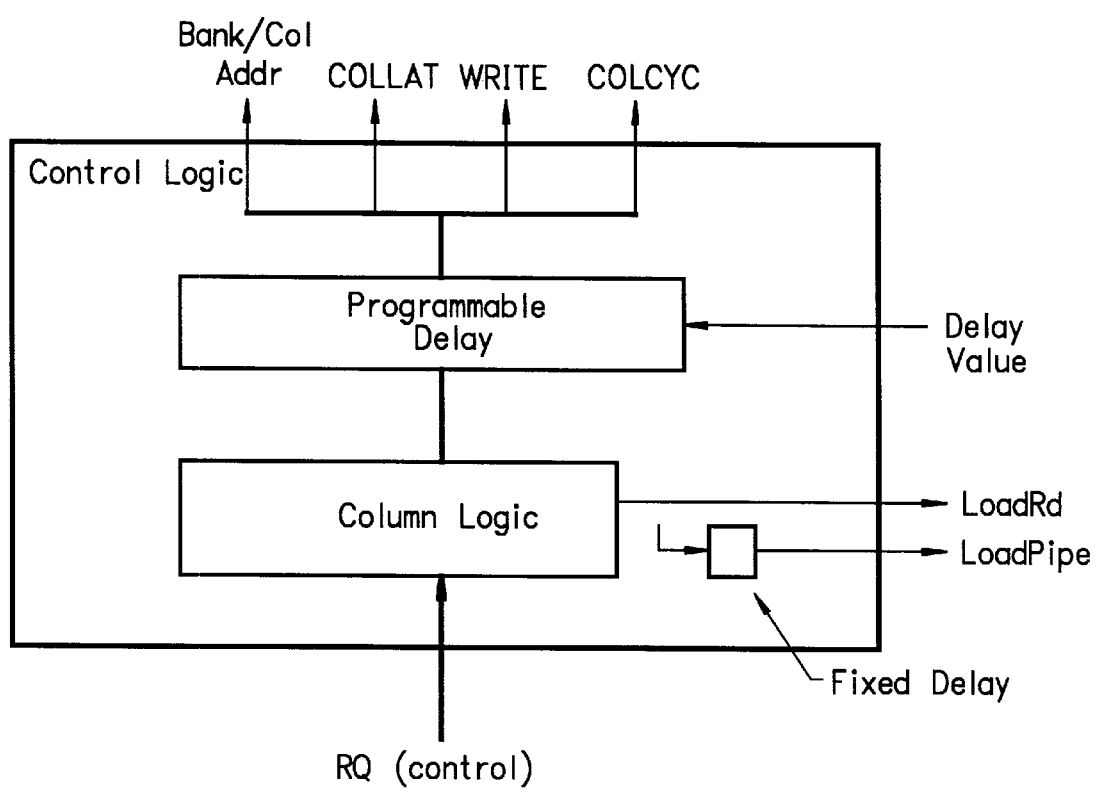
FIG. 33 illustrates a delay block within column logic to delay the start of column operations in accordance with an embodiment of the invention.
Figure 34:
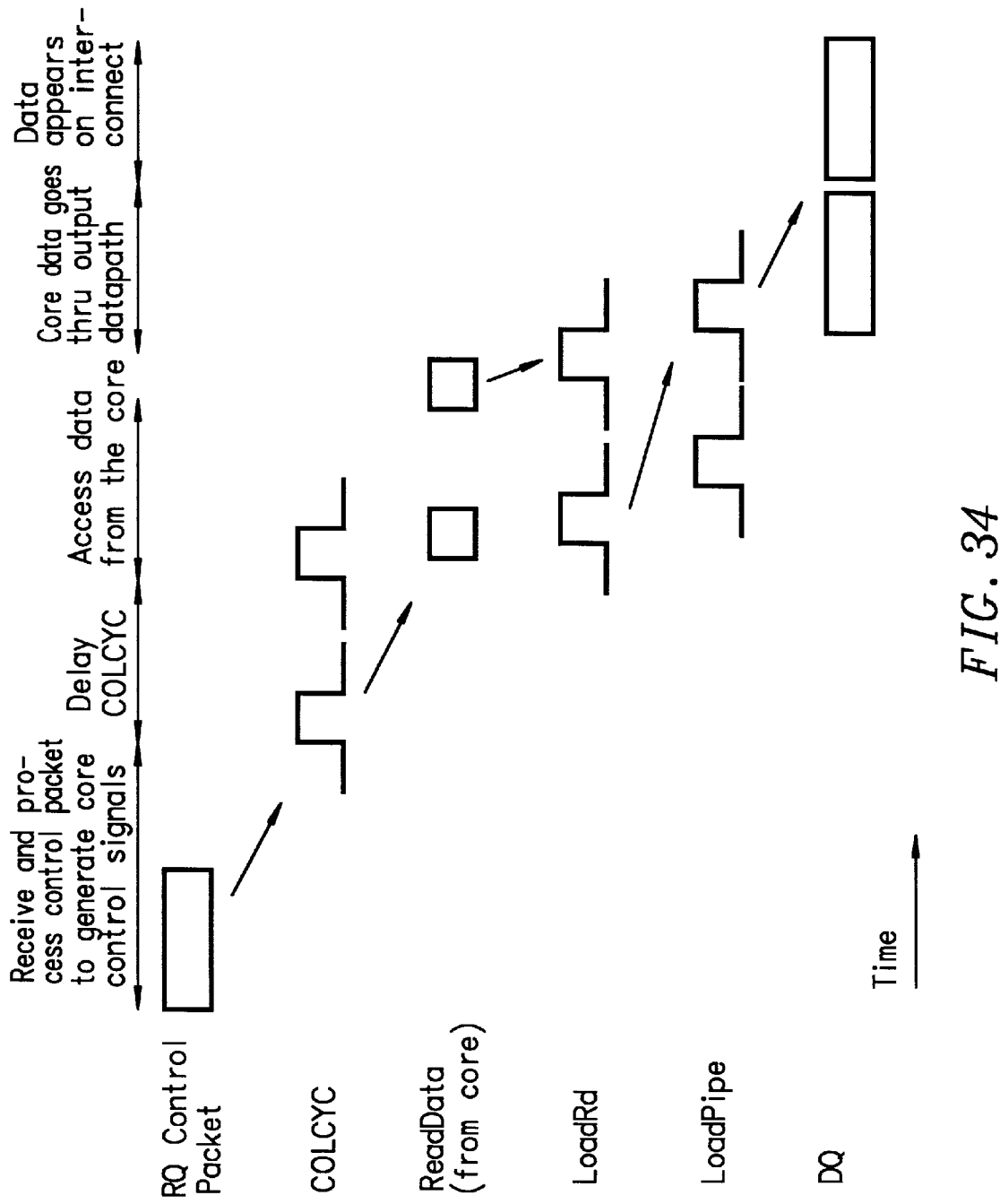
FIG. 34 illustrates the operation of delaying reads by delaying the start of column operations in accordance with an embodiment of the invention.

To illustrate a front-end leveling implementation, FIG. 33 shows the added delay block in the column logic block, which delays the issuance of the COLCYC command. The delay block can be programmable in order to allow variable delays. FIG. 34 shows that by delaying COLCYC, the data is also delayed.

Figure 35:
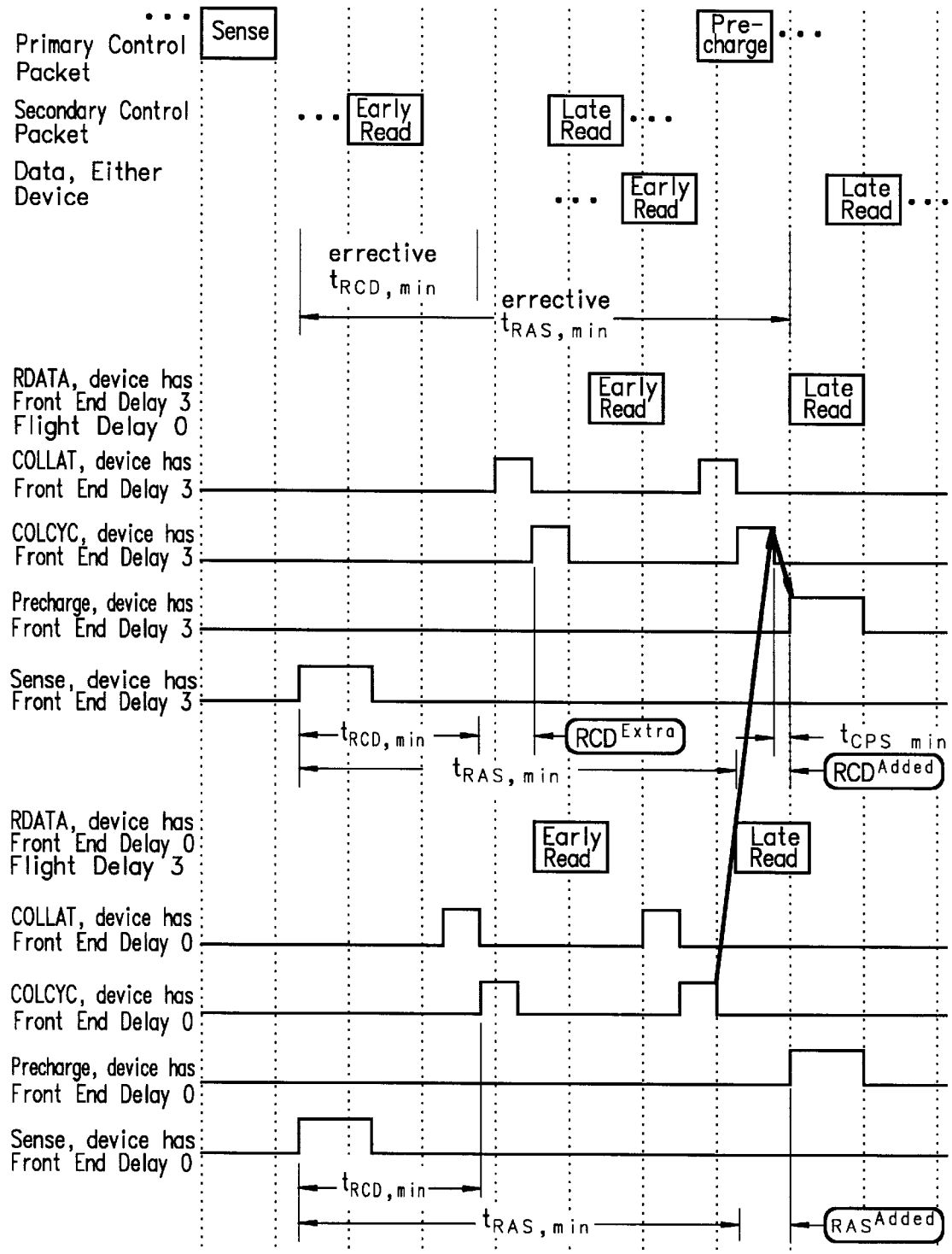
FIG. 35 illustrates front end leveling in accordance with an embodiment of the invention

The problem with delaying the start of the column read operation is that it introduces interactions with row precharge operations which can increase control complexity and degrade performance. FIG. 35 shows the operation of two devices using front-end leveling. One device is shown with a leveling delay of 3 cycles and an interconnect delay of 0 cycles, the 'close' device. The lower device is shown with added delay of 0 cycles and an interconnect delay of 3 cycle, the 'far' device.

It is desirable for the memory system to operate with the same control patterns and intervals for each device in the memory system. This reduces the complexity of the master, which would otherwise need to look up the specifics of each device as it performs memory operations. It also may increase bandwidth by maintaining a consistent repeating sequence for the different stages of the pipelined access to the memory devices. Alternatively, the controller can track the timing of each device, but this greatly increases controller complexity and the variable tRAS,min timing makes it hard to form an efficient pipeline.

FIG. 35 shows that the late read of the 'close' device defines the earliest time that a precharge may be performed to meet the constraint of $t_{CPS,min}$. The read is positioned to show that for the 'far' device, the precharge could have been performed 3 cycles earlier and met both constraints, for $t_{CPS,min}$ and $t_{RAS,min}$.

The effective $t_{RAS,min}$ is 3 cycles longer than the actual $t_{RAS,min}$ of either device. This increases the occupancy time of a bank for any row, which can increase the latency to access a different row in the same bank and reduce performance. The delayed precharge may also prevent another bank from being precharged at the optimal time.

Figure 36:
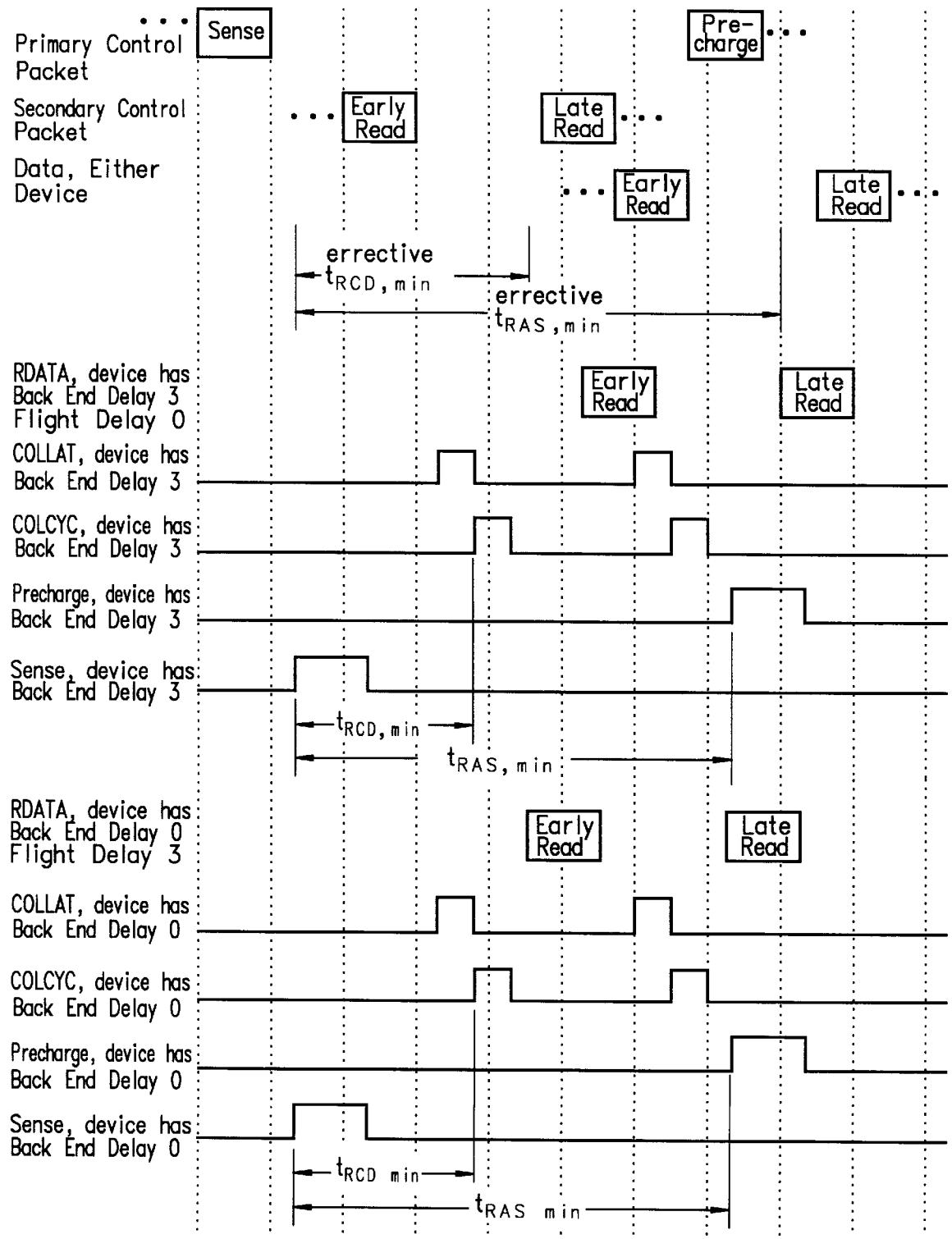
FIG. 36 illustrates back end leveling in accordance with an embodiment of the invention.

The preferred method for delaying read data is to delay the data after it arrives from the core. This way, the timing of the core read operations stays fixed, and interactions with precharge are eliminated. FIG. 36 shows that the problems shown in FIG. 35 do not occur with back end leveling because the COLCYC positions are identical for the two devices.

Figure 37:
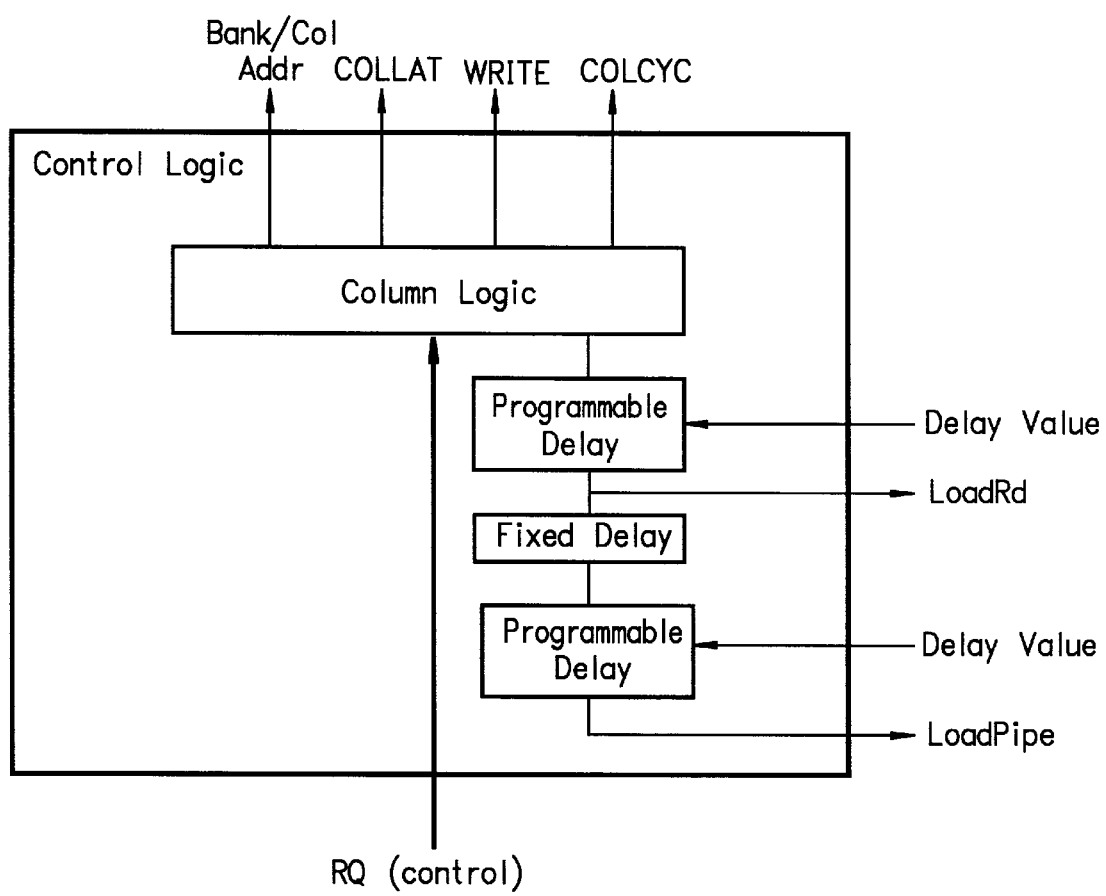
FIG. 37 illustrates delay circuits to delay data on an output datapath in accordance with an embodiment of the invention.
Figure 38:
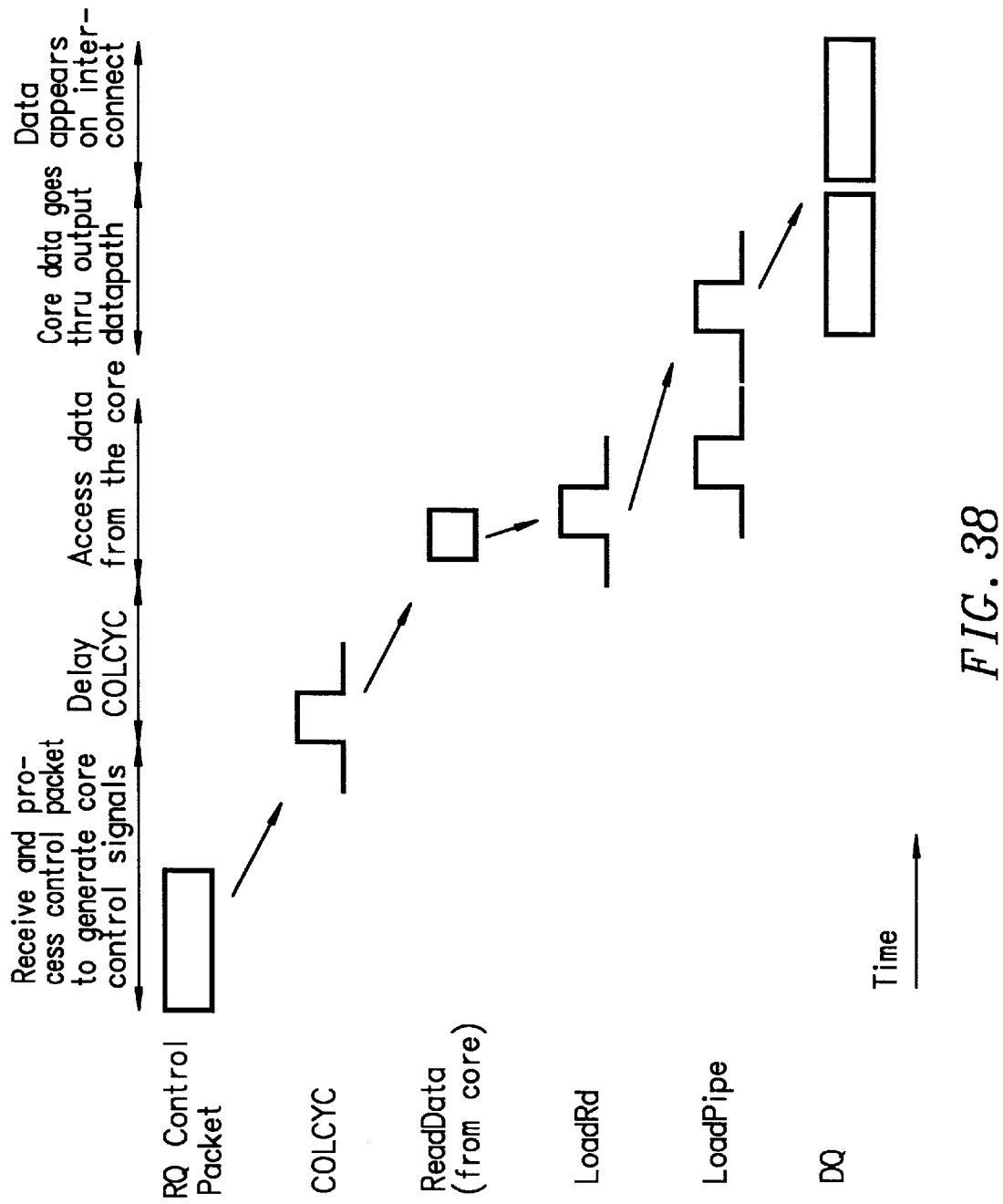
FIG. 38 illustrates the operation of delaying reads by delaying data to an output datapath in accordance with an embodiment of the invention.
Figure 39:
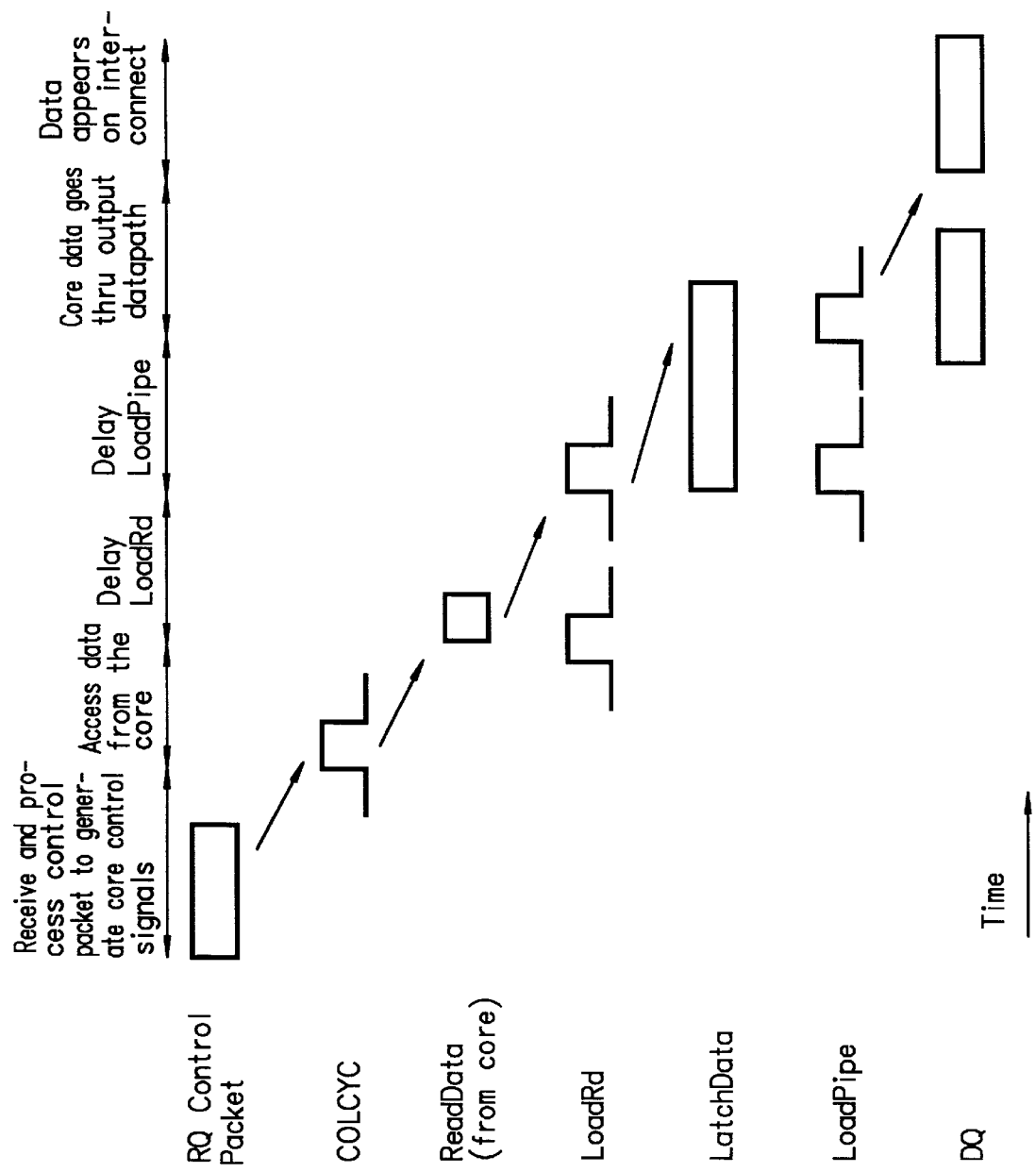
FIG. 39 illustrates column read timing in accordance with an embodiment of the invention.

The column read datapath shown in FIG. 31 shows separate load control points at both the latch and output datapath (LoadRd and LoadPipe). The interface provides two places to introduce read delay, and FIG. 37 shows programmable delay elements used for both control signals. Both of these delay elements can be used to compensate for interconnect timing variation. FIG. 38 illustrates the operation of delaying reads by delaying data to an output datapath. FIG. 39 illustrates column read timing using the LoadRd and LoadPipe signals.

Figure 1:
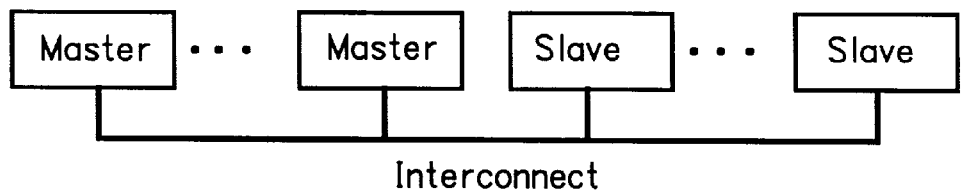
FIG. 1 illustrates a prior art memory system with multiple masters and multiple slaves.
Figure 2:
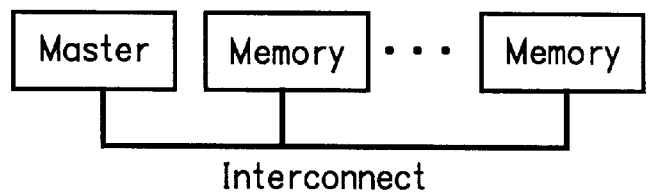
FIG. 2 illustrates a prior art memory system with a single master and multiple slaves.
Figure 3:
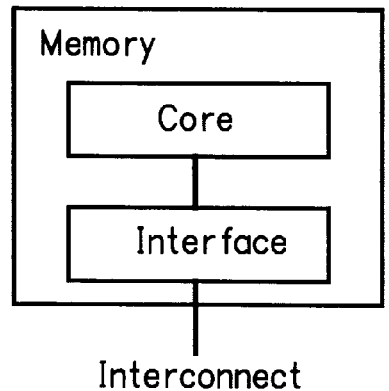
FIG. 3 is a generalized schematic of a prior art memory structure.
Figure 4:
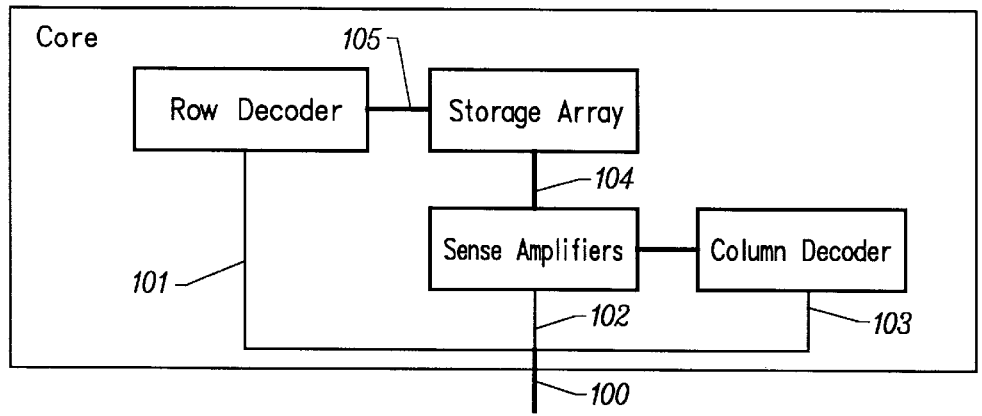
FIG. 4 is a generalized schematic of a prior art memory core with a single memory bank.
Figure 5:
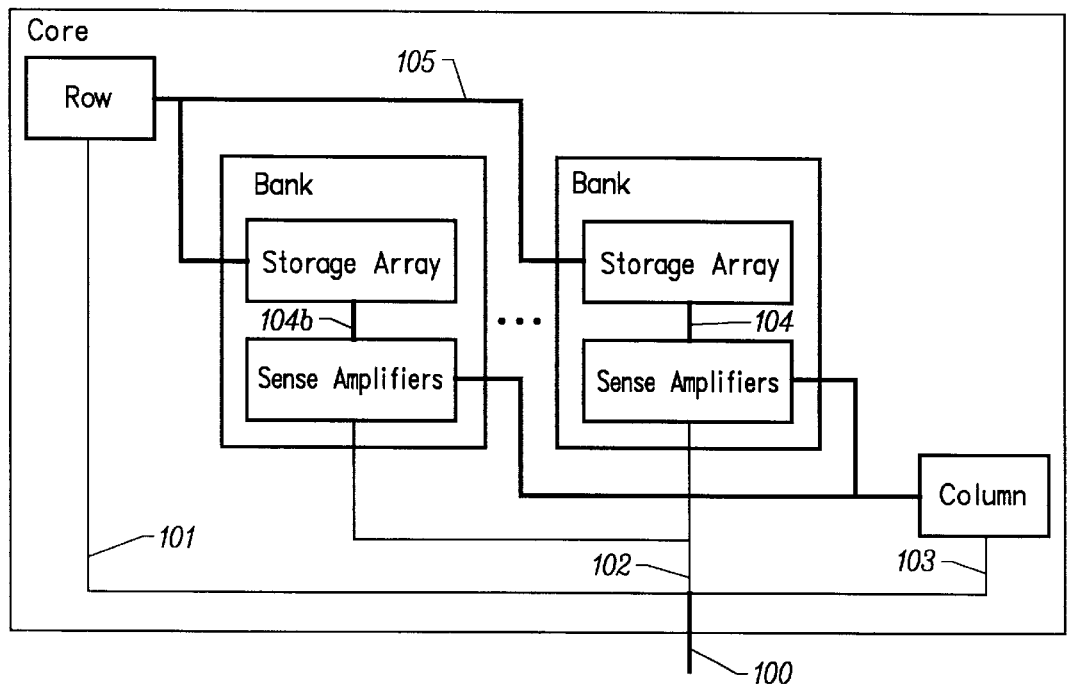
FIG. 5 is a generalized schematic of a prior art memory core with multiple memory banks.
Figure 6:
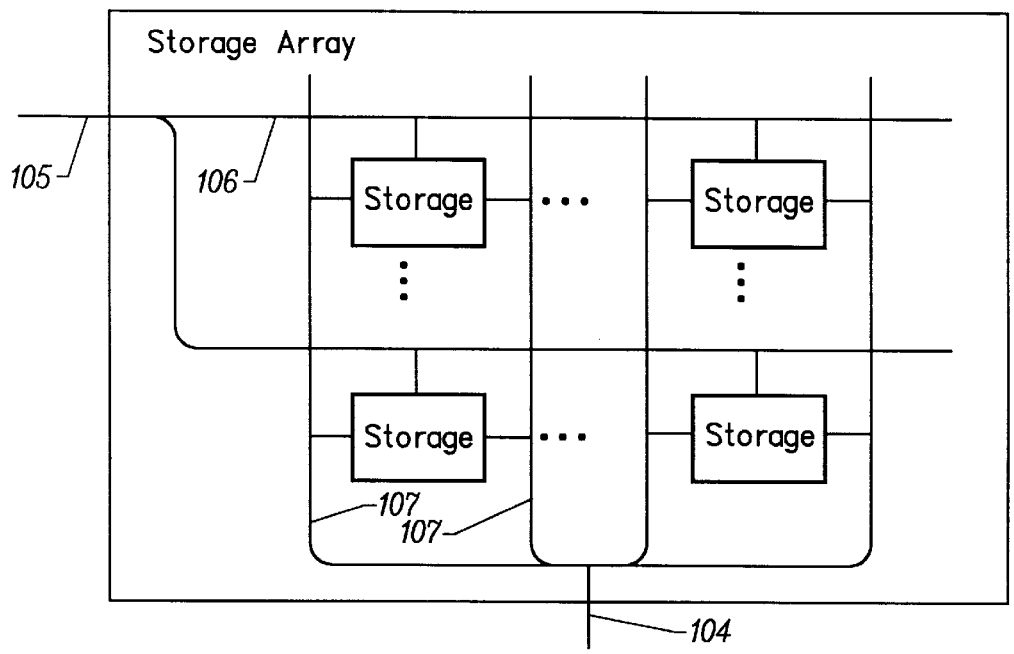
FIG. 6 is a generalized schematic of a prior art memory storage array.
Figure 7:
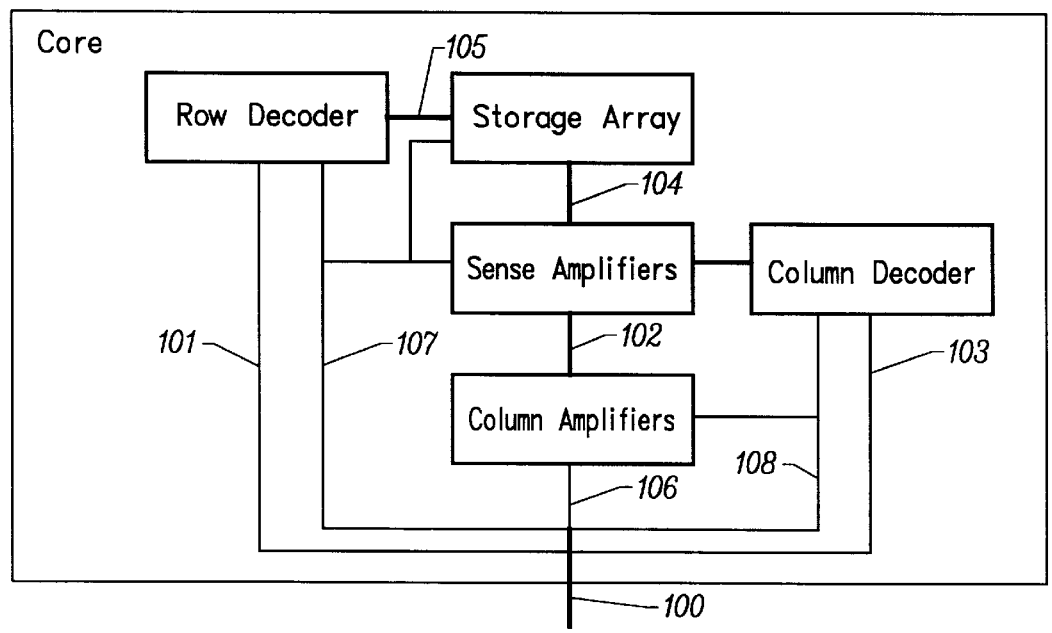
FIG. 7 is a generalized schematic of a prior art single bank DRAM memory core.
Figure 8:
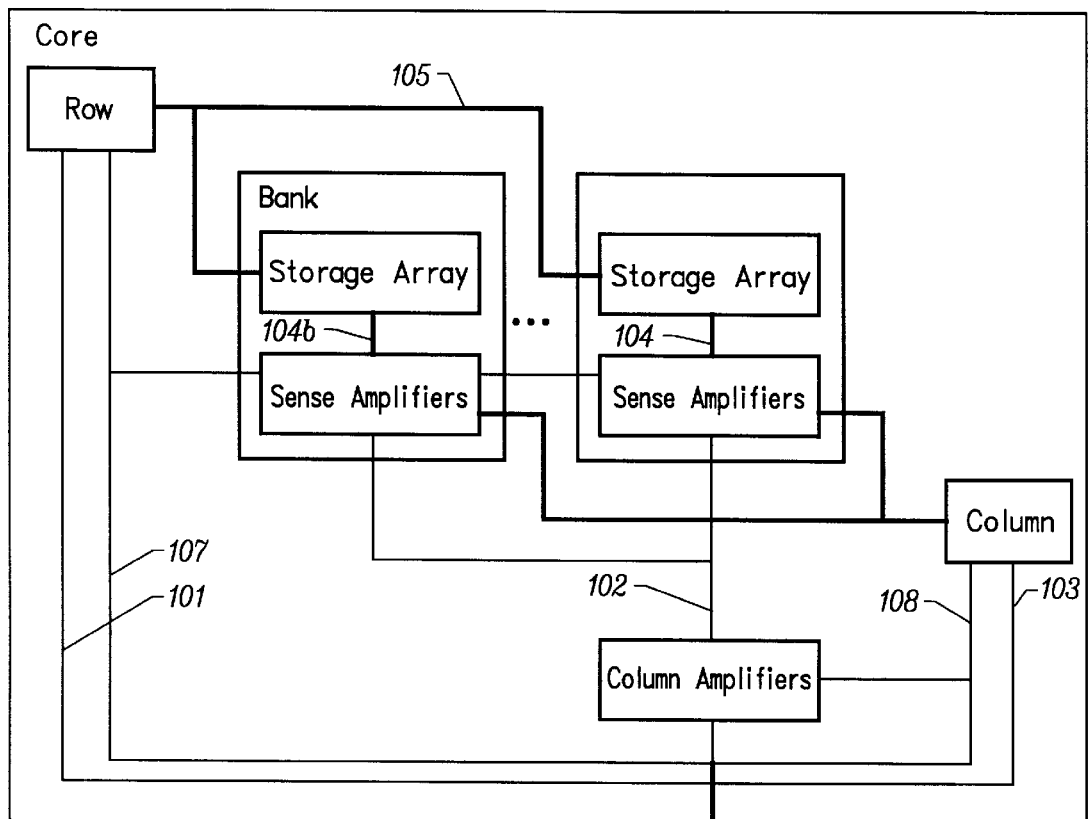
FIG. 8 is a generalized schematic of a prior art multiple bank DRAM memory core.
Figure 9:
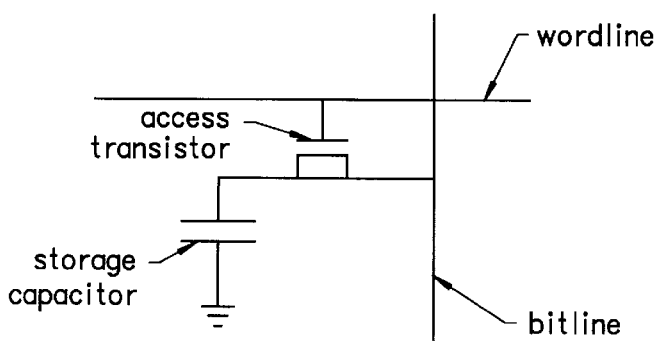
FIG. 9 is a schematic of a prior art DRAM memory cell.
Figure 10:
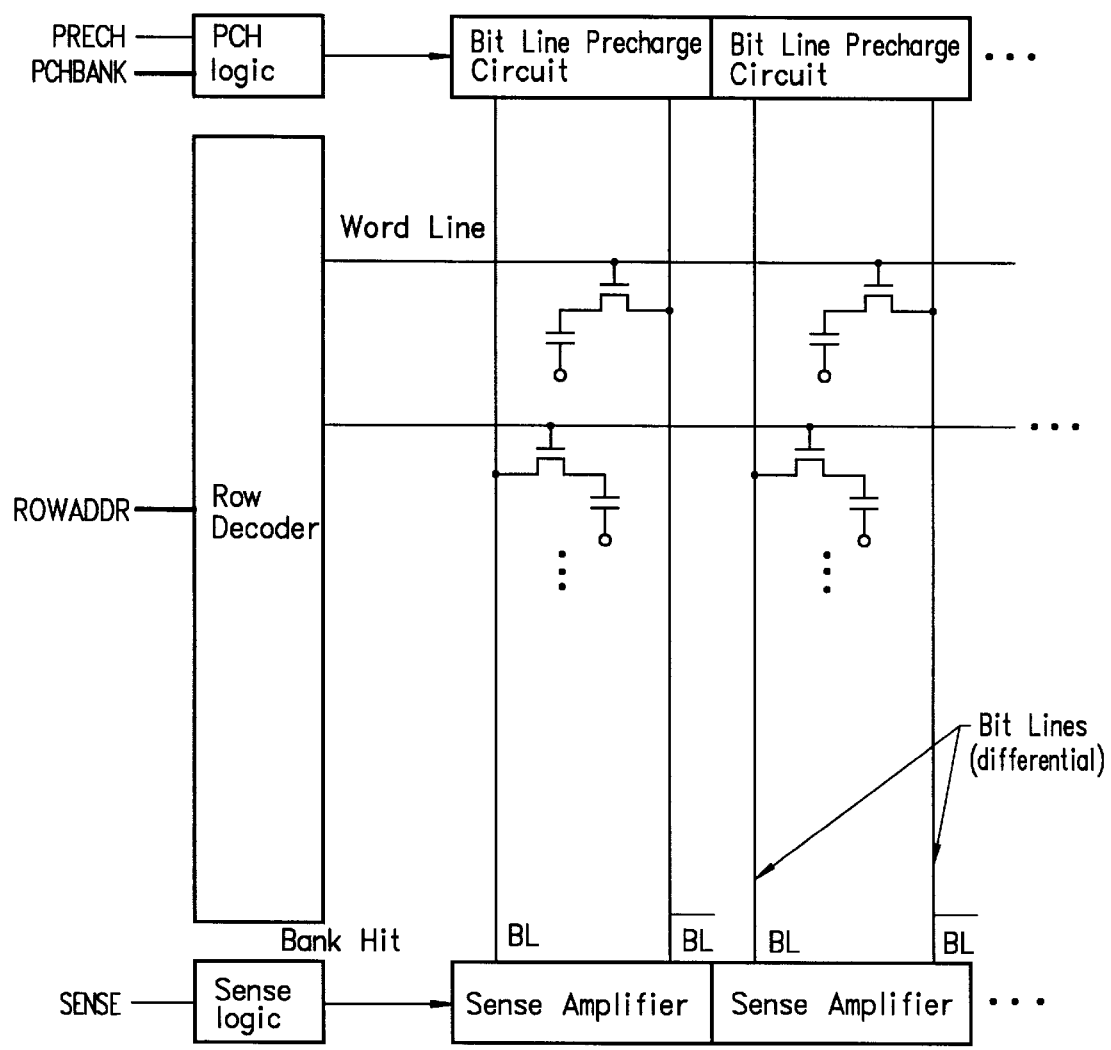
FIG. 10 is a schematic of a prior art DRAM datapath row.
Figure 11:
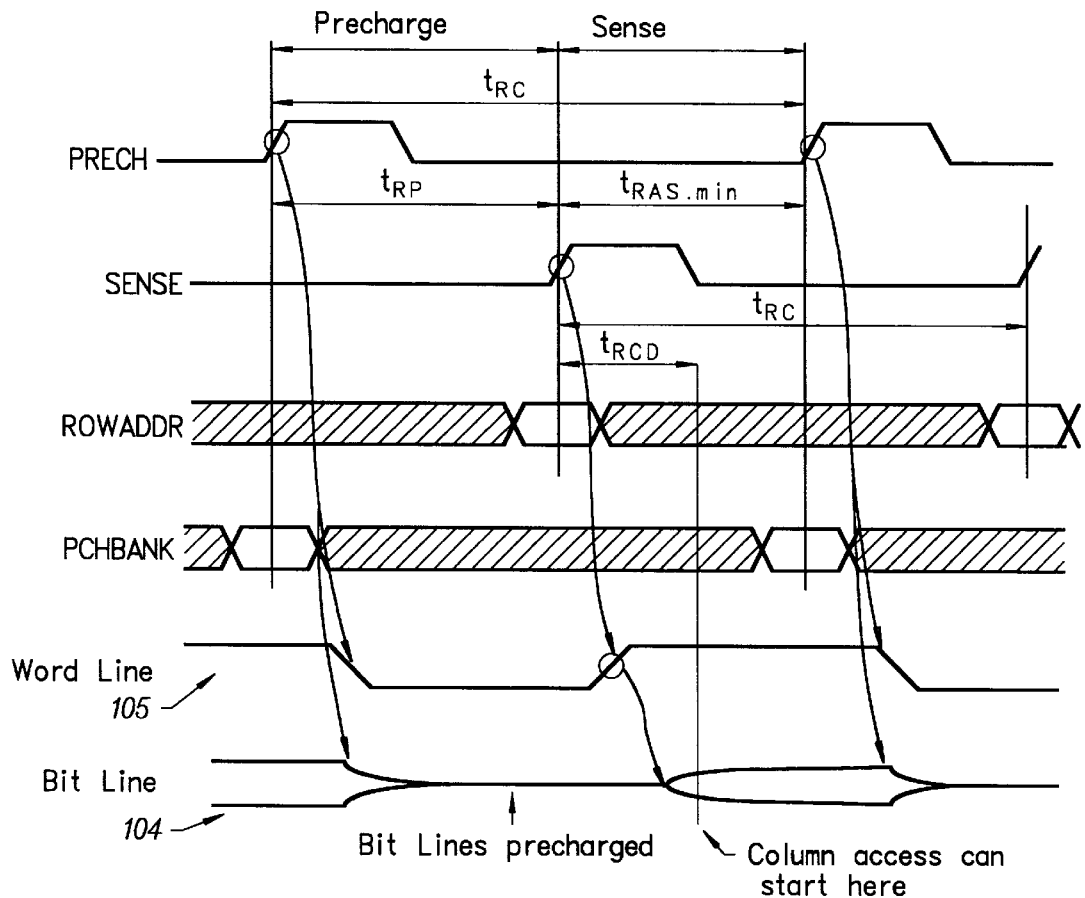
FIG. 11 is a timing diagram showing prior art row access timing to a single memory bank.
Figure 12:
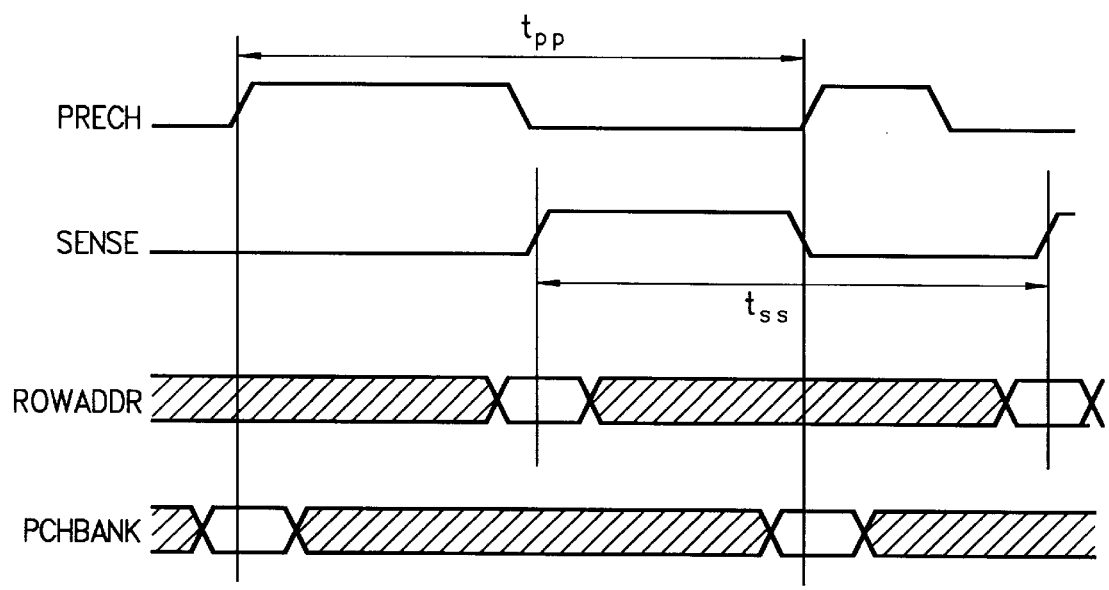
FIG. 12 is a timing diagram showing prior art row access timing to different memory banks.
Figure 13:
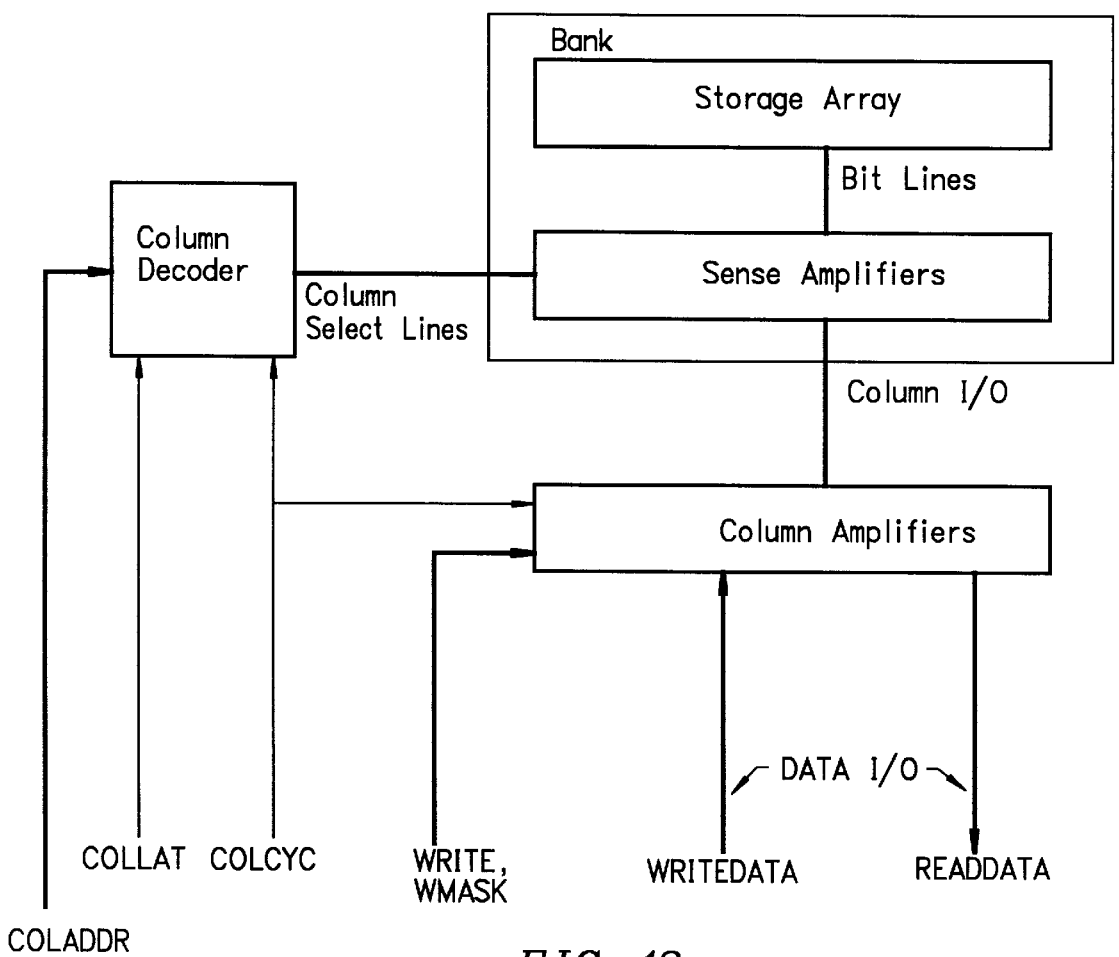
FIG. 13 illustrates a prior art DRAM column datapath.
Figure 14:
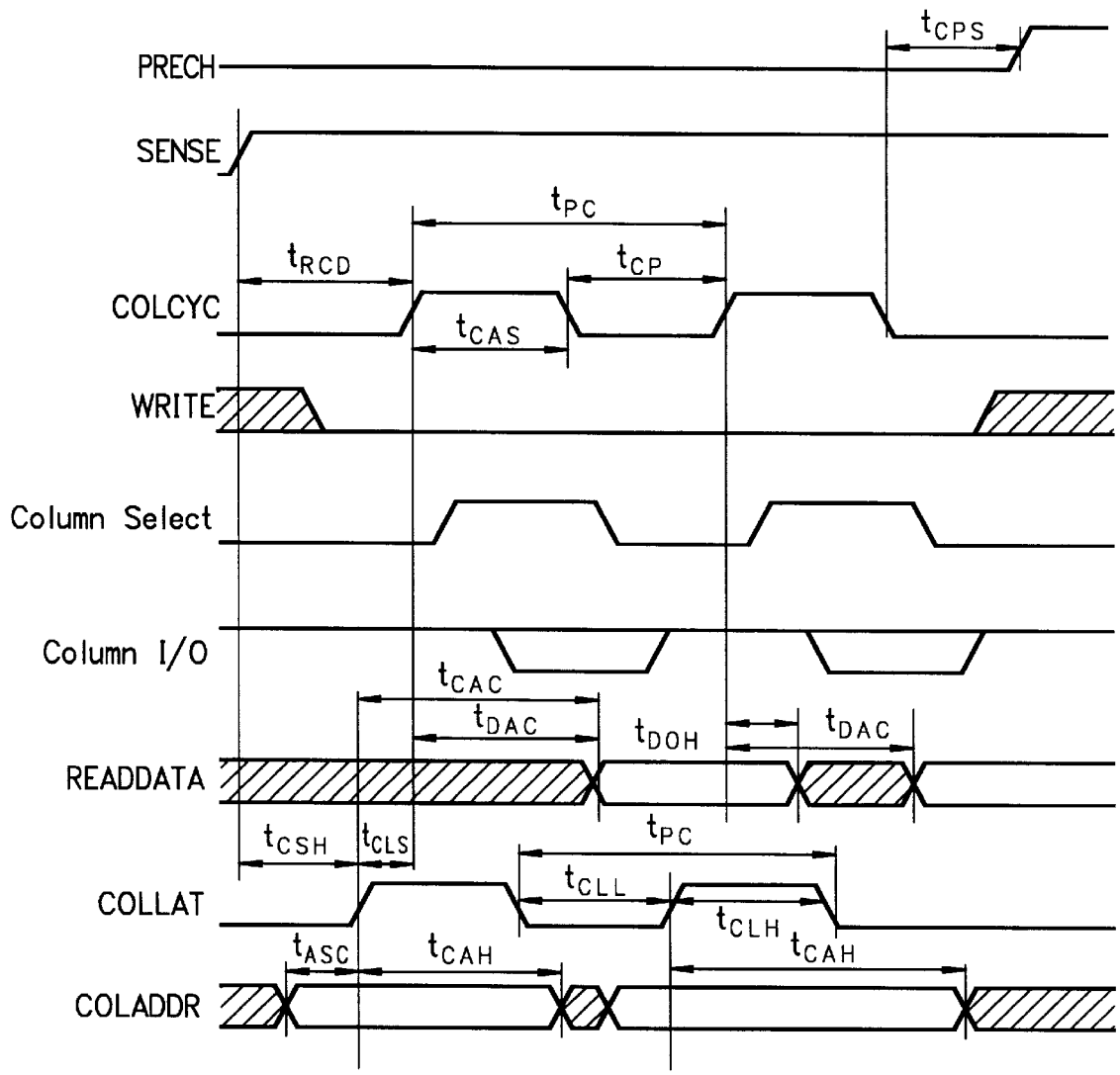
FIG. 14 illustrates a timing diagram showing prior art column read access timing.
Figure 15:
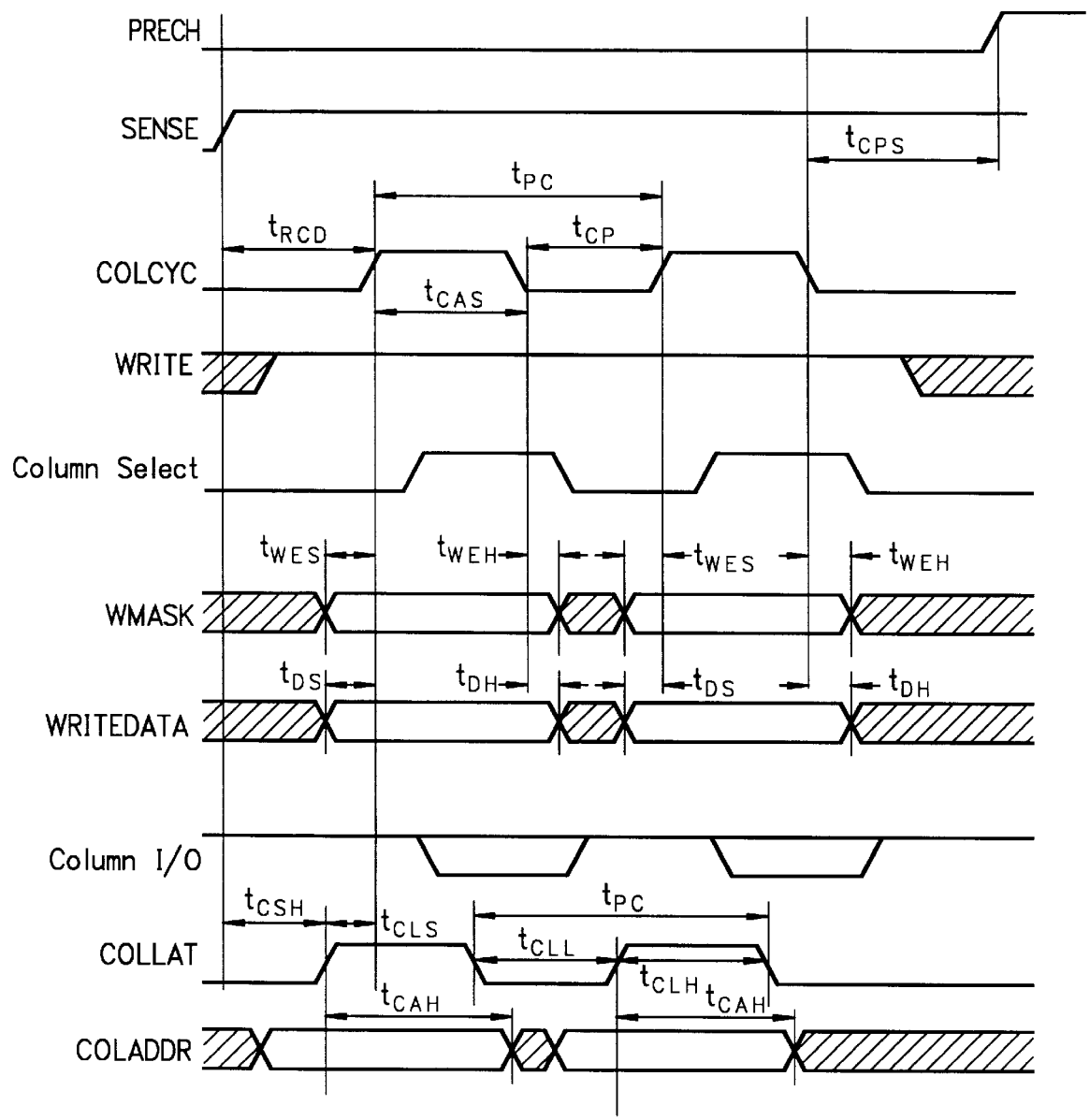
FIG. 15 illustrates a timing diagram of prior art column write access timing.
Figure 16:
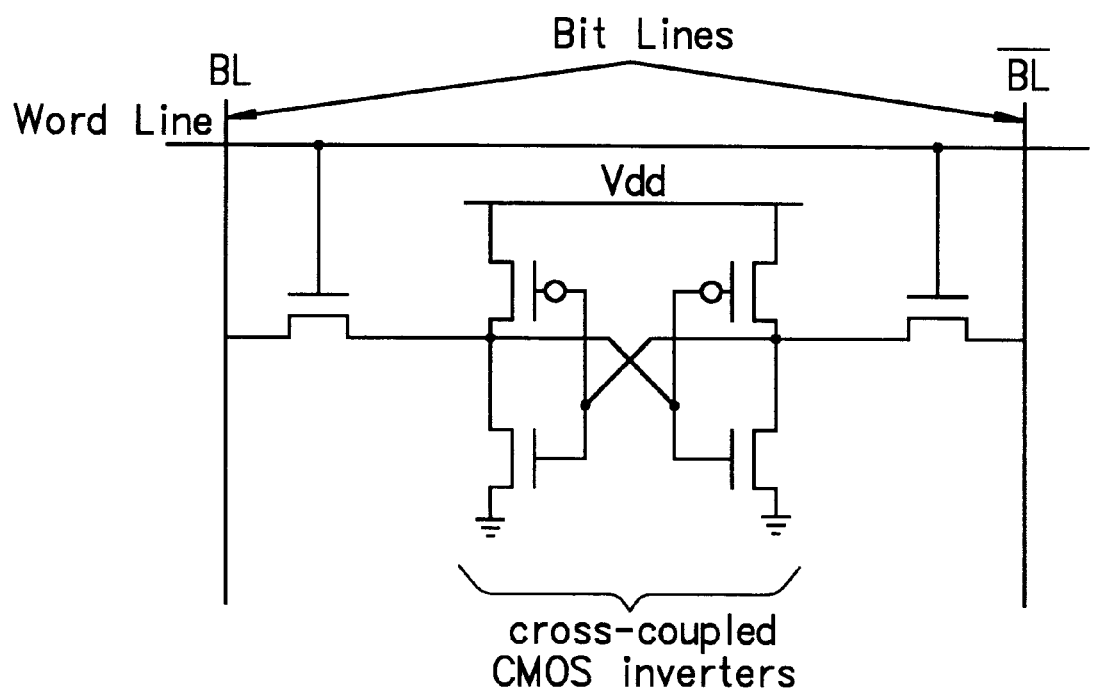
FIG. 16 is a schematic of a prior art SRAM memory cell.
Figure 17:
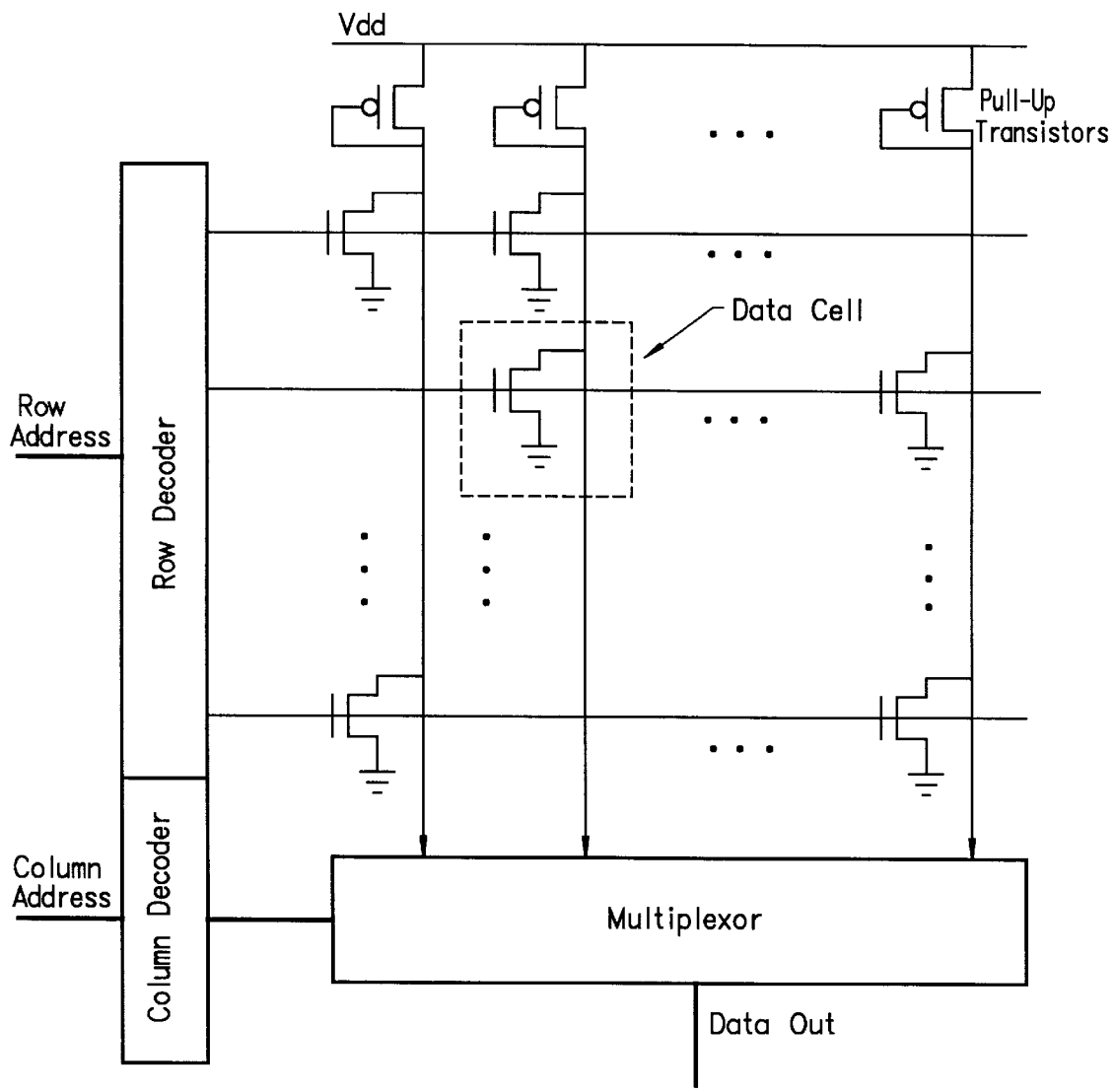
FIG. 17 illustrates a prior art ROM array.
Figure 18:
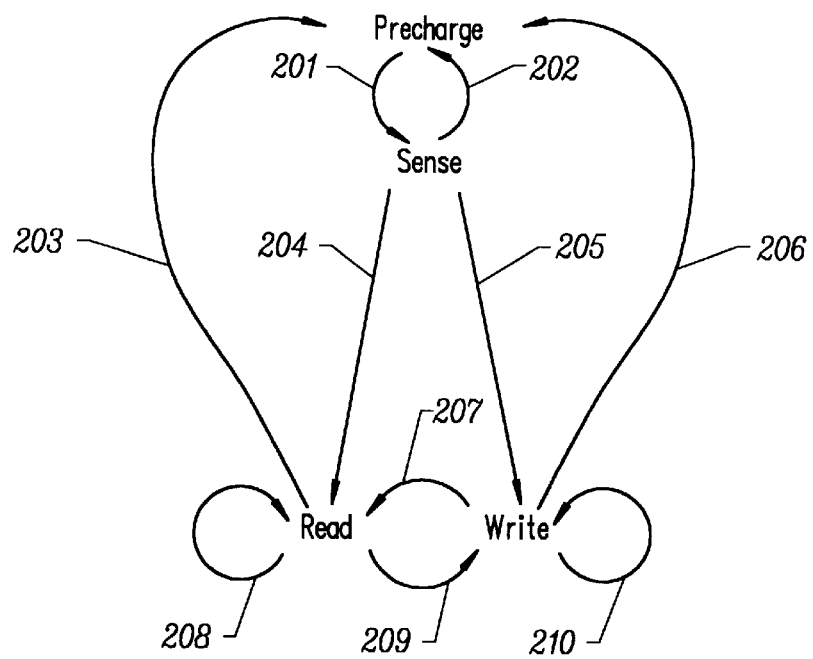
FIG. 18 illustrates prior art operation sequences for memory cores with row sensing.
Figure 19:
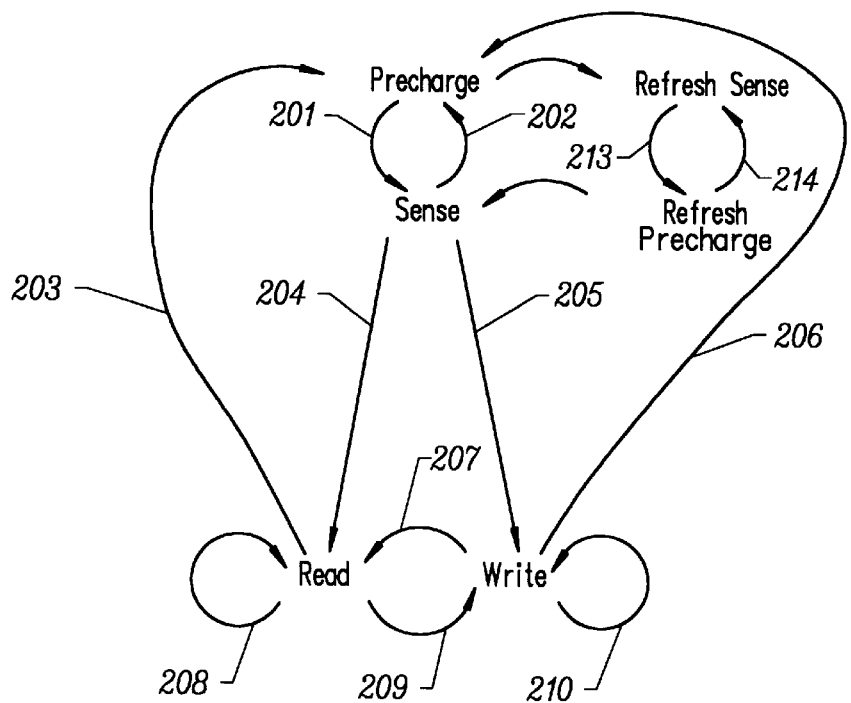
FIG. 19 illustrates prior art operation sequences for DRAMs with refresh operations.
Figure 20:
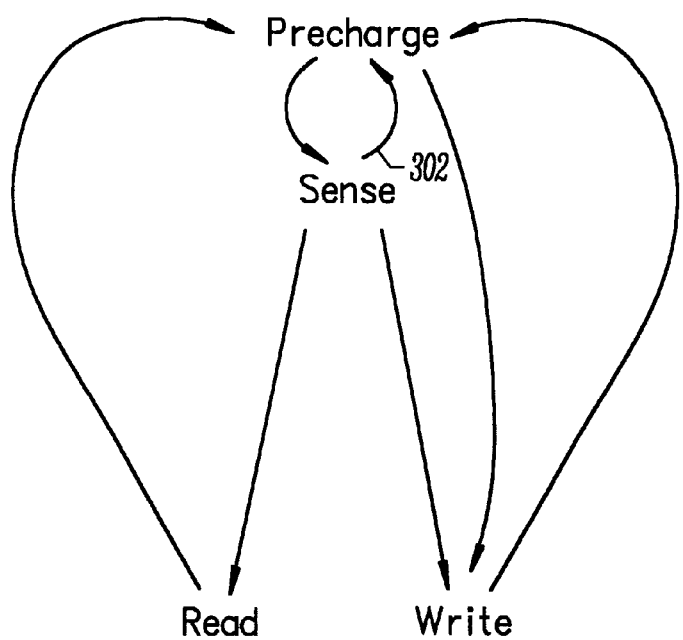
FIG. 20 illustrates prior art operation sequences for SRAMs with narrow page sizes.
Figure 21:
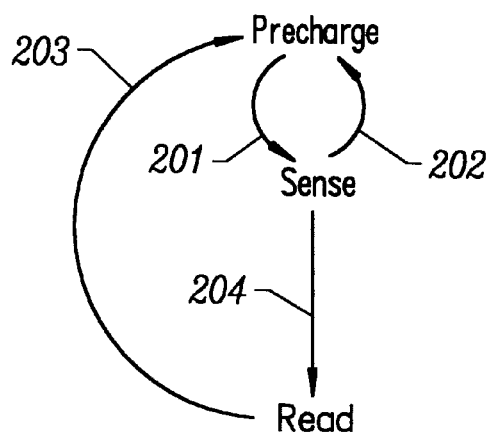
FIG. 21 illustrates prior art operation sequences for ROMs with sense amplifiers.
Figure 22:
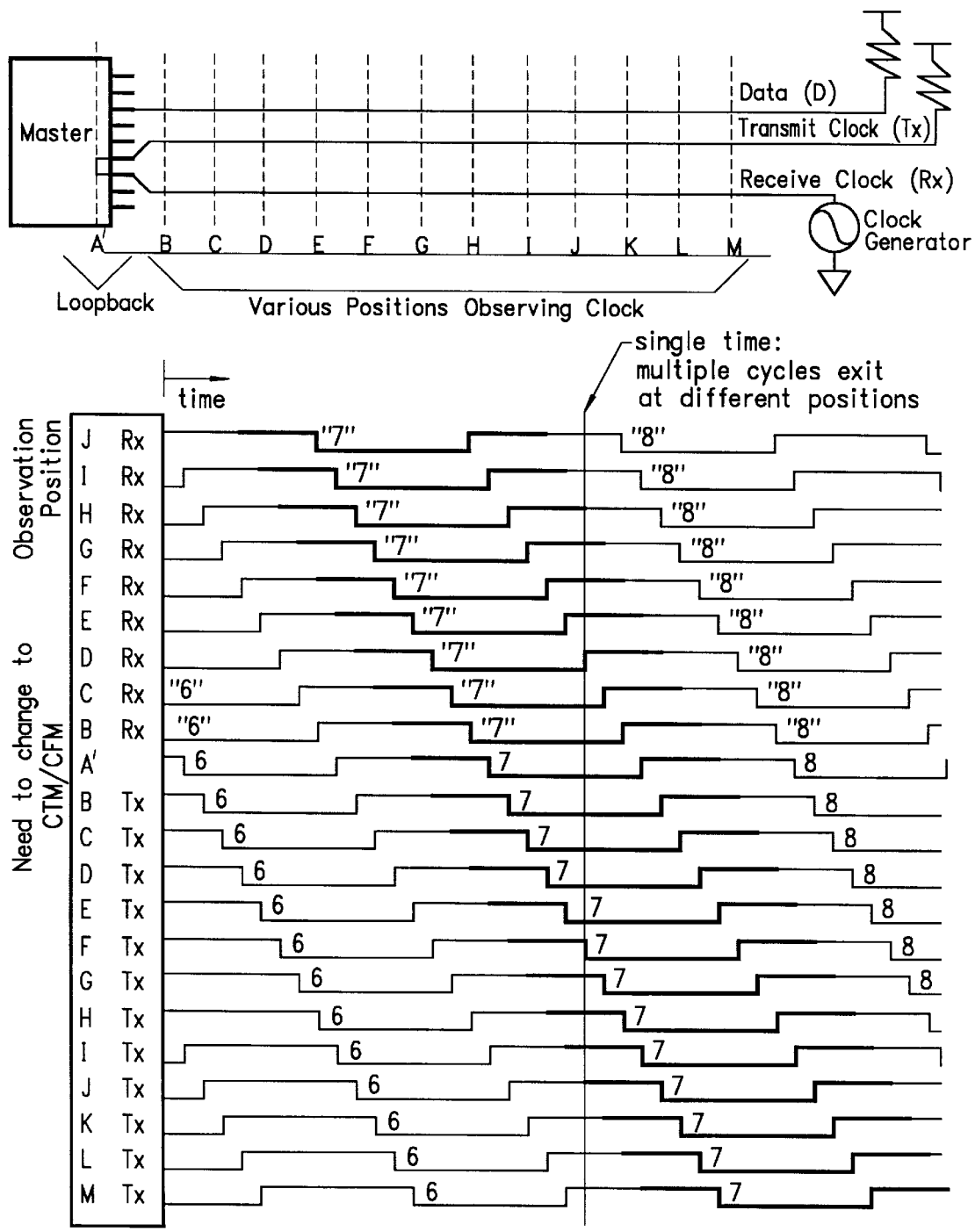
FIG. 22 illustrates multiple cycle timing in prior art memory system.
Figure 24:
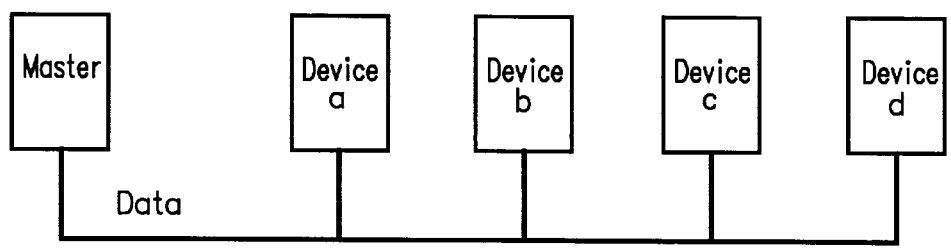
FIG. 24 illustrates a fully packed data interconnect.
Figure 25:
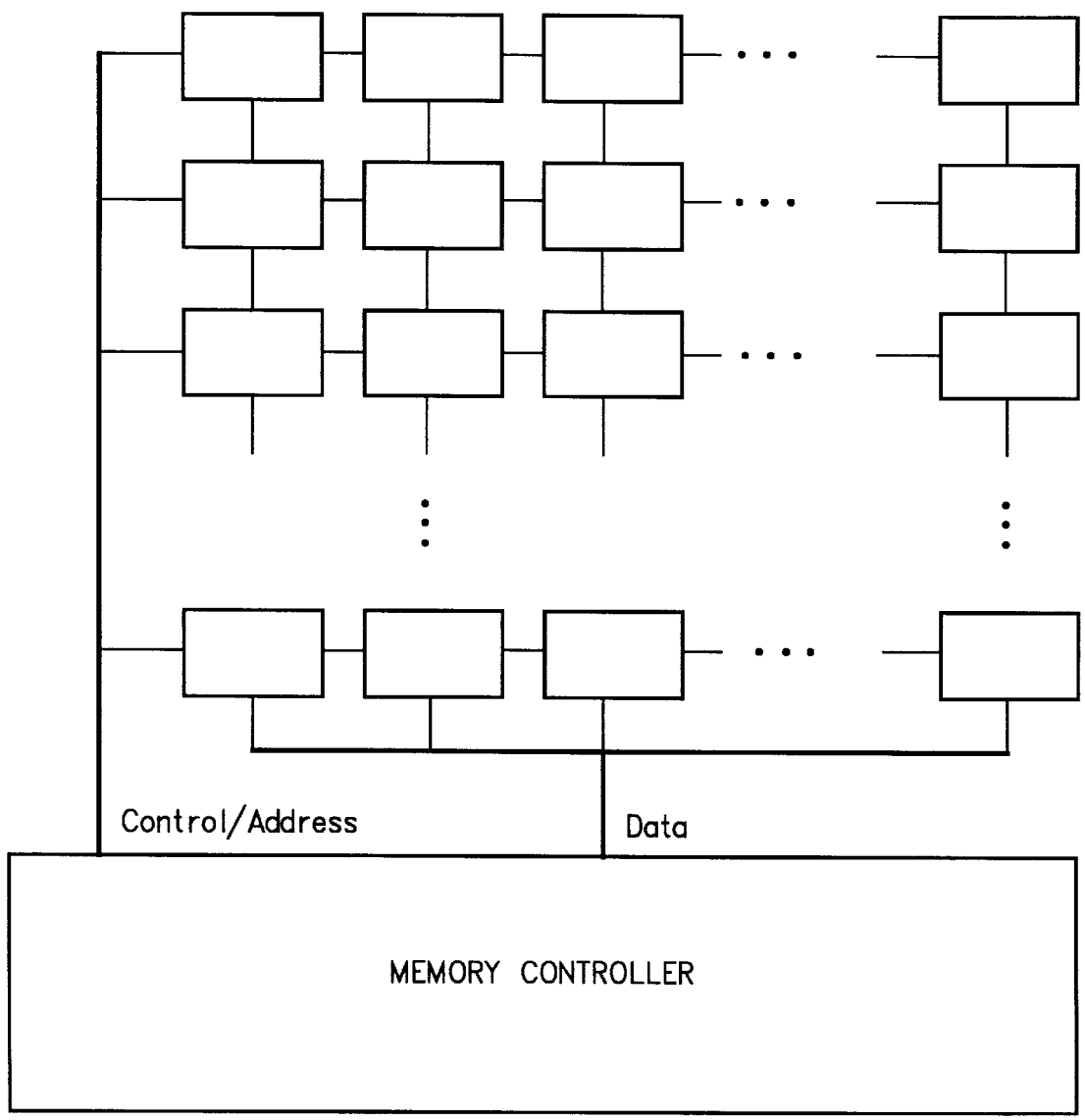
FIG. 25 illustrates a prior art memory system topology.
Figure 27:
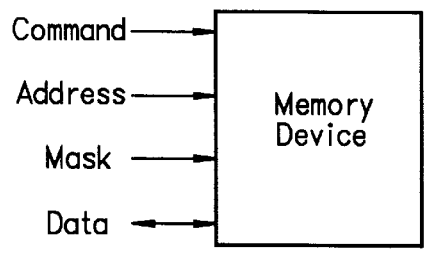
FIG. 27 illustrates a prior art memory device with overloaded interconnect control resources
Figure 28:
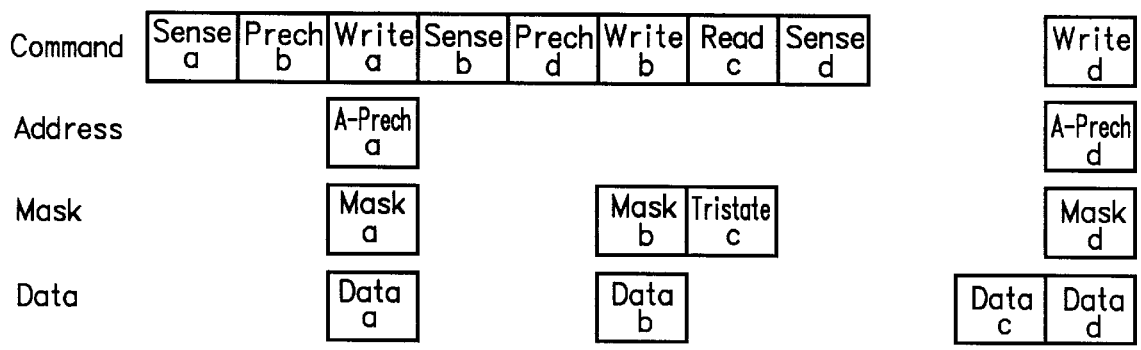
FIG. 28 is a timing diagram demonstrating prior art overload of an interconnect resource.

Note that the delay of LoadRd only allows for a finite range of added delay, since the output valid window of the read data from the core is limited (read valid window=tPC−tDAC+tDOH, as shown in FIG. 14) and must meet the set-up and hold requirements of the latch. Beyond this finite range, additional buffering would be required to increase the read valid window size. This would add area and introduce more critical path problems given the desire for minimum read latency.

Having two control points is particularly helpful since the amount of programmable delay for each load signal is typically limited due to hardware and timing constraints. The two control points increases the total range of read delay and allows for longer multicycle channels with more clock domains. Furthermore, as described later, the delay of LoadRd can also be used to allow for programmable variation in tDAC. In this case, any remaining delay not used for TDAC can be used to perform back-end leveling.

There are multiple ways to control these delay elements. For example:

registers set when the memory subsystem is initialized; in this fashion every reference will have latency set by the worst case memory component, considering both position on the channel as well as internal device delays. The initialization method, as shown in FIG. 40, retrieves information characterizing the delays and positions of actual installed components and appropriately programs the delay registers in the devices.

delay sent with other control information; in this case the controller can dynamically control the positioning of the read data; this allows the controller to optimize the latency as well as the bandwidth as a function of which device transmitted the previous data block and which device is transmitting the next data block.

One embodiment uses static control within the DRAM. This choice conserves control bandwidth, which is a scarce resource, and minimizes critical paths within the DRAM interface.

Timing Compensation for Device Delay Variation

Every memory device has delay variations due to process variation, circuit design, supply voltage, and operating temperature. These variations affect the row and column operation times, as well as the timing of interactions between row and column operations.

The present invention include the following mechanisms to compensate for device-induced timing variations:

the use of timing offsets between control commands sent over split control interconnect resources to provide finer timing control over internal device operations the use of multiple programmable delay mechanisms inside the device that match with internal device delay components to allow fine grain timing control.

Timing Offsets Between Split Control

Figure 42:
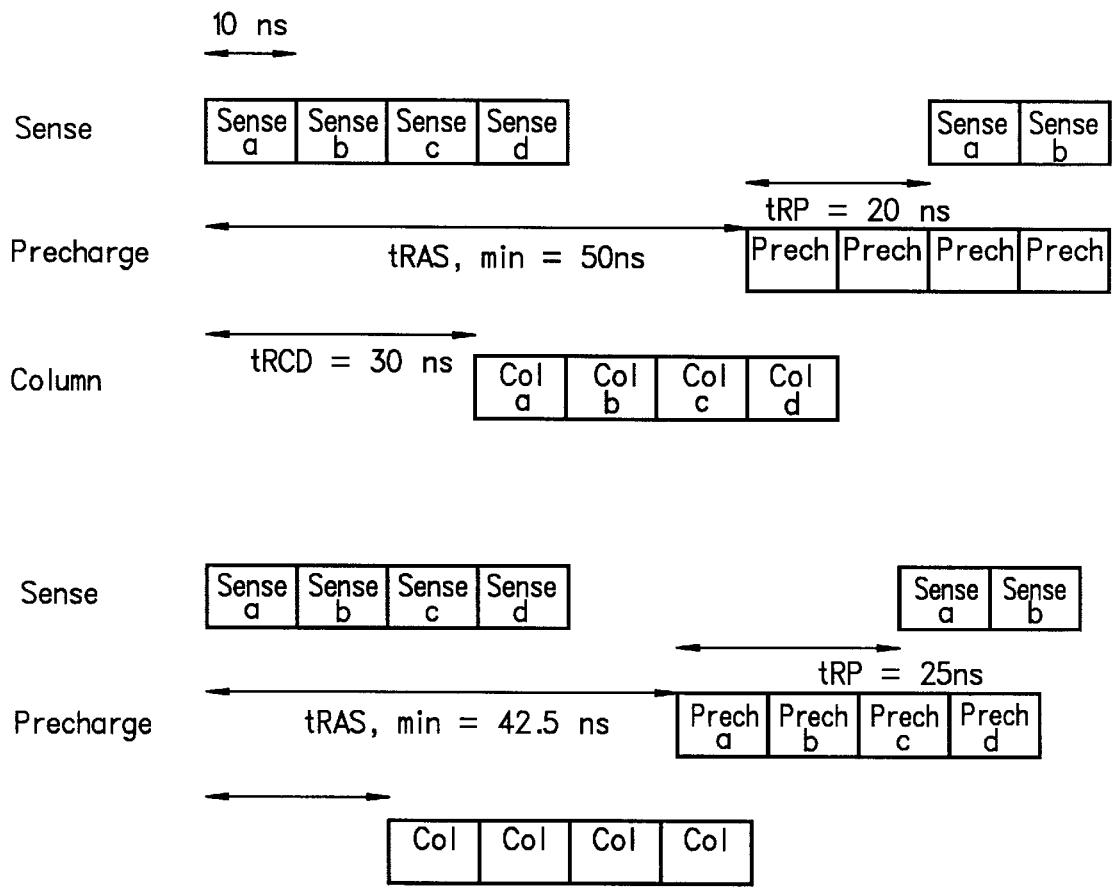
FIG. 42 illustrates timing offsets of row and column commands in accordance with an embodiment of the invention.

The present invention includes the use of timing offsets between control commands sent over split control interconnect resources to provide finer control over internal device operations. The primary memory device operations are precharge, sense, column read, and column write. In one embodiment, the device has an interconnect structure shown in FIG. 41, where the control wires and internal control datapaths are split into separate precharge, sense, and column control buses. The timing diagram in FIG. 42 shows how timing offsets can be used to control row timing and row to column timing for this embodiment. Here, the controller can adjust the timing offsets between the sense, precharge, and column commands with clock cycle granularity to match the device timing for sense to column delay, tRCD, sense to precharge delay, tRAS,min, and precharge to sense delay, tRP. The figure shows the timing offsets for tRCD of 30 ns and 20 ns, tRAS,min of 50 ns and 42.5 ns, and tRP of 20 ns and 25 ns. Since the interconnect resources for sense and column are split and independent, fine timing control of these internal device operations is achieved.

Figure 43:
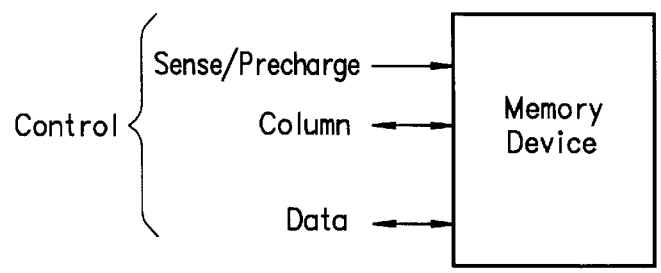
FIG. 43 illustrates merged control buses with separate column control in accordance with an embodiment of the invention.

Another embodiment may combine interconnect resources to lower device and system cost. These compromises generally reduce the ability to finely control timing using offsets in favor of lower cost or higher latency (due to packetization of information). One example of this is to combine precharge and sense into a single interconnect resource, so that there are only sense/precharge and column control buses as shown in FIG. 43. In this case the timing offsets technique cannot be used to control sense to precharge timing interactions, but can still be used to control sense to column (tRCD) and column to precharge (tCPS) timings. Another example of this is to combine precharge and sense into a single interconnect resource and also combine column and precharge into another interconnect resource, such that precharge can be controlled from either resource.

Programmable Delay Mechanisms for Device-Induced Timing Variation

The present invention also uses multiple programmable delay mechanisms inside the device that match with internal device delay components to allow fine grain timing control. An example of this is the control of column read latency. The column read latency in the memory core, tCAC, comprises two components originating from different parts of the column datapath: tCLS and tDAC, as FIG. 14 shows. tCLS is the delay between the rising edge of COLLAT, when the column address is latched into the core, and the rising edge of COLCYC, when the column access begins and data is accessed from the sense amps in the core. These two delays can vary from device to device, depending on process variation, circuit design, supply voltage, and operating temperature.

Prior art devices have used delay elements to compensate for delay variation in column read latency, but have only used a single delay value to cover multiple column read latency components. The present invention differs from the prior art in that individual delay components are used that correspond to specific portions of the internal delays of the device.

Each of these techniques has its costs and benefits. The all encompassing delay provides a clean control model to the application that does not vary with internal memory device implementation details. However, this requires the memory device to decode for itself how the single programmed delay should be divided into the separate delays of the column datapath and should be converted into the correct number of clock cycles. This can be a very difficult problem since the delay of any one device is not known at design time. A further complication is that the period of the clock during operation is not known, even at final test time when the device delays can be measured. Methods involving division of an internal memory device delay by the clock period are not considered simple and is a logically expensive operation to put into a device.

Dividing the coded delays into portions which correspond to internal memory device delays and making these available to the controller (e.g. via internal device registers) makes the division problem easy for the memory device since all decisions have been pushed back to the application layer. Now the burden is on the application to have enough intelligence to know the frequency of operation, read the device delay requirements, and use a method to program each one of them. The division problem can easily be performed in software and is eliminated from the memory device. The memory device only must present the proper control mechanisms so that the software can perform the task. Divided coded delays also provide finer grain timing control, which, for example, is useful in compensating for variations in processing, which may not affect each delay stage equally.

FIG. 31 shows the components of the column read path. As described earlier, the column read access latency, tCAC, comprises two components: tCLS and tDAC.

Figure 44:
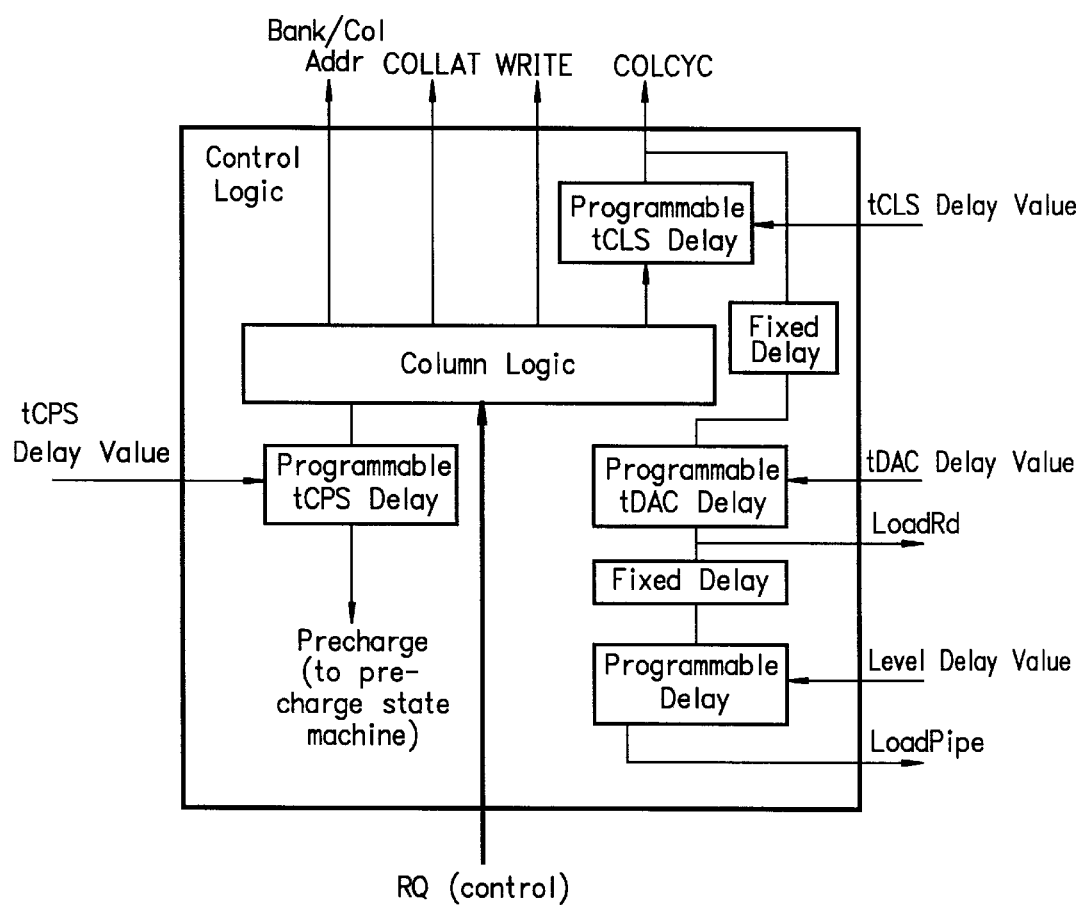
FIG. 44 illustrates column control logic with selected delays in accordance with an embodiment of the invention.
Figure 45:
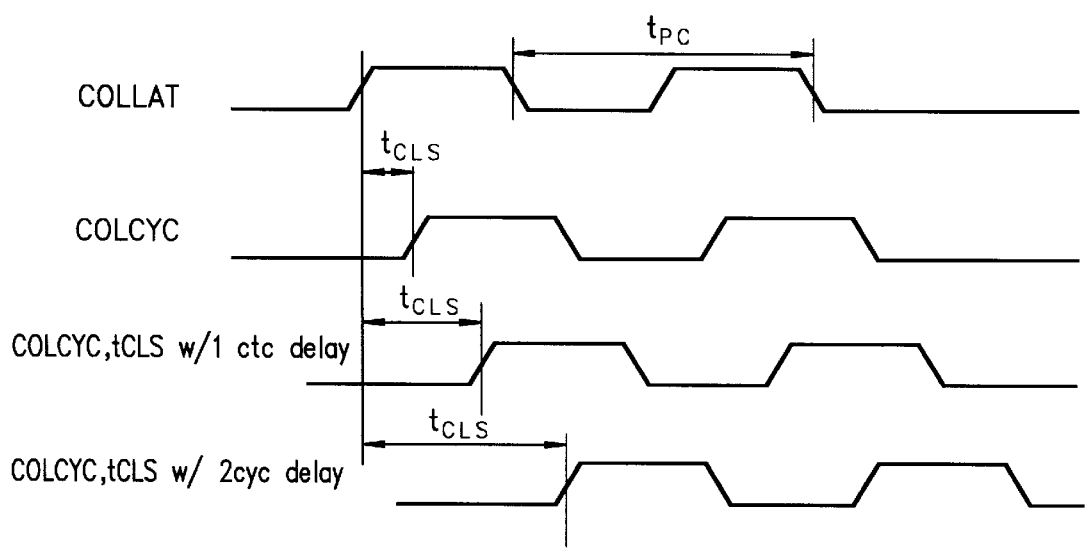
FIG. 45 varied delay signal in accordance with an embodiment of the invention.

FIG. 44 shows one way to implement a programmable delay for tCLS, which delays the COLCYC control signal and effectively increases tCLS. The variation of tCLS is shown in FIG. 45.

Variable tDAC is achieved by delaying the LoadRd signal into the latch at the core output. As described earlier, the range of delay on LoadRd is limited, since the output valid window of the read data from the core is limited (read valid window=tPC−tDAC+tDOH, as shown in FIG. 14) and must meet the set-up and hold requirements of the latch. Beyond this finite range, additional buffering would be required to increase the read valid window size. This would add area and introduce more critical path problems given the desire for minimum read latency. Note that the programmable delay of LoadRd can be used to compensate either variable tDAC or interconnect delay variation. Any remaining delay not used for tDAC can be used to perform back-end leveling to compensate for interconnect delay variation.

Other timing parameters of column operations can also be programmable. For instance, the column to row precharge timing, tCPS, as shown in the timing diagram in FIG. 14, can be programmable by adding a programmable delay to the precharge signal that is triggered by the column logic and sent to the precharge state machine. Also, tCAS, the time between the rising and falling edges of COLCYC, can also be made programmable and can be useful depending on how the edges are used by the core. For instance, if a core design uses the rising edge to start the column access operation and falling edge to perform column precharge, the programmable tCAS would be very useful if there are timing variations in when the column precharge could begin after the column access starts. To implement this, a programmable delay element needs to be added to the COLCYC logic in order to allow variable timing of the falling edge.

The major techniques to control these delay elements for device-induced timing variation are similar to those described for interconnect-induced timing variation, although slightly different:

dynamic coded delay; in this case the control is actually sent to the memory device at times other than when a fixed delay to the memory core can be applied; instead an additional delay determined by the control information sent with the reference is added to the nominal control delay from receipt of control information until its application to the memory core static coded delay; in this case a register within the memory device that is programmed at initialization time controls how much delay is added between receipt of control information and application to the core. The initialization method, as shown in FIG. 46, retrieves information characterizing the delays and positions of actual installed components and appropriately programs the delay registers in the devices.

The internal device delays of memory component column operations can be broken up into easily parameterized elements that remain stable over the lifetime of any particular controller. Since this is true, the preferred embodiment uses statically coded individual delay components. Even these could cause critical path problems without careful design.

All of the device induced delay components can be statically compensated since, once compensated, they have no effect on channel bandwidth. They have only slight effect on average channel service time. Due to the relatively small effect on channel performance there is little to gain from dynamically coding the delays, especially since the critical path effects are significant.

A person skilled in art will recognize the following: a receiver and transmitter can be combined in one device; a master and slave can be combined in one device; alternate embodiments may control different partitions of the column access path; alternate embodiments may use different mechanisms to control any controllable interval; methods can be used for any interconnect induced delay variations and any device which has an internal block which has various operations and delay constraints between those operations which vary; and the invention is not limited to devices with memory cores, but in general, any type of device.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A system comprising:
   a communication bus;
   a pair of clock lines, each clock line routed along the length of said communication bus, one of said clock lines carrying a clock signal traveling in one direction, the other one of said clock lines carrying a clock signal traveling in the opposite direction;
   a master device coupled to a data bus comprising said communication bus and said clock lines, said master device selectively applying signals to said communication bus; and a plurality of slave memory devices coupled to said data bus, each slave memory device of said plurality of slave memory devices having an associated latency delay arising from its position on said data bus, each slave memory device including delay circuitry to compensate for said associated latency delay such that said master device observes a uniform latency for each slave memory device in response to applying signals to said communication bus, and wherein at least one slave memory device includes delay circuitry to delay the start of a column operation by delaying column control signals to establish front-end delay leveling.

2. The memory device of claim 1, wherein said associated latency delays, arising from position on said data bus, differ for first and second ones of said slave memory devices by at least one clock cycle of said clock.

3. A system comprising:
a communication bus;
a pair of clock lines, each clock line routed along the length of said communication bus, one of said clock lines carrying a clock signal traveling in one direction, the other one of said clock lines carrying a clock signal traveling in the opposite direction;
a master device coupled to a data bus comprising said communication bus and said clock lines, said master device selectively applying signals to said communication bus; and
a plurality of slave memory devices coupled to said data bus, each slave memory device of said plurality of slave memory devices having an associated latency delay arising from its position on said data bus, each slave memory device including delay circuitry to compensate for said associated latency delay such that said master device observes a uniform latency for each slave memory device in response to applying signals to said communication bus, and wherein each slave memory device includes delay circuitry to delay read data core output to establish back-end delay leveling.

4. The memory device of claim 3, wherein said associated latency delays, arising from position on said data bus, differ for first and second ones of said slave memory devices by at least one clock cycle of said clock.

5. A memory device, comprising:
a memory core;
a plurality of connections coupled to an interconnect structure for carrying control commands; and
interface circuitry, comprising multiple programmable delay components that correspond to respective specific portions of internal delays of said interface circuitry, coupled to said plurality of connections to receive said control commands and coupled to said memory core to perform row and column operations on said memory core in accordance with said control commands, wherein when said control commands are received with predefined timing offsets, the predefined timing offsets combined with delays associated with the programmable delay components match the timing between said row and column operations.

6. The memory device of claim 5, wherein the delay associated with at least one of said multiple programmable delay components is configured to compensate for a time of flight latency delay associated with a position of the memory device on a communication bus, whereby a master device coupled to the communication bus observes a uniform latency for both the memory device and at least one other memory device on the communication bus in response to signals applied by the master device on the communication bus.

7. The memory device of claim 6, wherein said interface circuitry adjusts timing signals used within the memory core with clock cycle granularity, with respect to a clock signal whose clock cycle is governed external to the memory device, to match device timing for sense to column delay.

8. The memory device of claim 6, wherein said interface circuitry adjusts timing signals used within the memory core with clock cycle granularity, with respect to a clock signal whose clock cycle is governed external to the memory device, to match device timing for precharge to sense delay.

9. The memory device of claim 6, wherein said interface circuitry adjusts timing signals used within the memory core with clock cycle granularity, with respect to a clock signal whose clock cycle is governed external to the memory device, to match device timing for column to precharge delay.

10. The memory device of claim 6, wherein said control commands include primary memory device commands, including sense, precharge and column commands.

11. The memory device of claim 6, wherein said control commands include row and column commands.

12. The memory device of claim 6, wherein at least two of said programmable delay components are positioned serially within a single data path of the interface circuitry so that delays associated with the at least two programmable delay components have a cumulative effect on operation of the memory device.

13. The memory device of claim 12, wherein first and second programmable delay components of said multiple programmable delay components are positioned within distinct first and second data paths of the interface circuitry so that delays associated with said first and second delay components affect timing of different operations on the memory device.

14. The memory device of claim 6, wherein first and second programmable delay components of said multiple programmable delay components are positioned within distinct first and second data paths of the interface circuitry so that delays associated with said first and second programmable delay components affect timing of different operations on the memory device.

15. A memory device, comprising:
a memory core;
a plurality of interconnect nodes to receive control commands; and
interface circuitry, comprising multiple programmable delay components that correspond to respective specific portions of internal delays of said interface circuitry, coupled between said plurality of interconnect nodes and said memory core, wherein at least two of said multiple programmable delay components are positioned serially within a single data path of the interface circuitry so that delays associated with the at least two programmable delay components have a cumulative effect on operation of the memory device.

16. The memory device of claim 15, wherein the delay associated with at least one of said multiple programmable delay components is configured to compensate for a time of flight latency delay associated with a position of the memory device on a communication bus, whereby a master device coupled to the communication bus observes a uniform latency for both the memory device and at least one other memory device on the communication bus in response to signals applied by the master device on the communication bus.

17. The memory device of claim 16, wherein first and second programmable delay components of said multiple programmable delay components are positioned within distinct first and second data paths of the interface circuitry so that delays associated with said first and second programmable delay components affect timing of different operations on the memory device.

18. A memory device, comprising:
- a plurality of connections coupled to an interconnect structure for carrying row and column commands;
- a memory core; and
- a memory interface coupled to said plurality of connections and said memory core, said memory interface including circuitry for generating memory core timing signals in accordance with said row commands and said column commands, said memory core timing signals having timing constraints to insure correct memory core operation, said memory interface circuitry including a plurality of individually programmable delay components for separately adjusting the timing of selected row operation timing signals and column operation timing signals of said memory core timing signals so as comply with said timing constraints.

19. The memory device of claim 18 wherein said memory interface circuitry adjusts said memory core timing signals with clock cycle granularity, with respect to a clock signal whose clock cycle is governed external to the memory device, to match device timing for sense-to-column delay.

20. The memory device of claim 18 wherein said memory interface circuitry adjusts said memory core timing signals with clock cycle granularity, with respect to a clock signal whose clock cycle is governed external to the memory device, to match device timing for sense-to-precharge delay.

21. The memory device of claim 18 wherein said memory interface circuitry adjusts said memory core timing signals with clock cycle granularity, with respect to a clock signal whose clock cycle is governed external to the memory device, to match device timing for precharge-to-sense delay.

22. The memory device of claim 18 wherein said memory interface circuitry adjusts said memory core timing signals with clock cycle granularity, with respect to a clock signal whose clock cycle is governed external to the memory device, to match device timing for column-to-precharge delay.

23. The memory device of claim 18, wherein the delay associated with at least one of said individually programmable delay components is configured to compensate for a time of flight latency delay associated with a position of the memory device on a communication bus, whereby a master device coupled to the communication bus observes a uniform latency for both the memory device and at least one other memory device on the communication bus in response to signals applied by the master device on the communication bus.

24. The memory device of claim 23, wherein at least two of said individually programmable delay components are positioned serially within a single data path of the interface circuitry so that delays associated with the at least two programmable delay components have a cumulative effect on operation of the memory device.

25. The memory device of claim 24, wherein first and second programmable delay components of said individually programmable delay components are positioned within distinct first and second data paths of the interface circuitry so that delays associated with said first and second programmable delay components affect timing of different operations on the memory device.

26. The memory device of claim 23, wherein first and second programmable delay components of said individually programmable delay components are positioned within distinct first and second data paths of the interface circuitry so that delays associated with said first and second programmable delay components affect timing of different operations on the memory device.

27. The memory device of claim 23, wherein said control commands include primary memory device commands, including sense, precharge and column commands.

28. The memory device of claim 23, wherein said control commands include row and column commands.

29. A method of configuring a system having a master device and a plurality of slave devices so that the master device observes uniform latency to all of the slave devices, comprising:
- configuring each of the slave devices such that programmable delays within said slave devices compensate for internal delays within said slave devices; and
- configuring each of the slave devices such that the programmable delays within said slave devices compensate for differences in time of flight delays from said master device to said slave devices.

* * * * *